(12) United States Patent
Wong et al.

(10) Patent No.: US 8,487,800 B2
(45) Date of Patent: Jul. 16, 2013

(54) RESISTIVE DIGITAL-TO-ANALOG CONVERSION

(75) Inventors: Ark-Chew Wong, Irvine, CA (US); Jonathan Muller, Neuchatel (CH)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 13/296,185

(22) Filed: Nov. 14, 2011

(65) Prior Publication Data
US 2013/0120176 A1    May 16, 2013

(51) Int. Cl.
*H03M 1/80* (2006.01)
*H03M 1/78* (2006.01)

(52) U.S. Cl.
CPC .............. *H03M 1/808* (2013.01); *H03M 1/785* (2013.01)
USPC .......................................... 341/153; 341/154

(58) Field of Classification Search
USPC .......................................... 341/144, 153, 154
See application file for complete search history.

(56) References Cited

U.S. PATENT DOCUMENTS

| | | | | |
|---|---|---|---|---|
| 4,318,085 A | * | 3/1982 | Whiteside et al. | 341/153 |
| 5,043,731 A | * | 8/1991 | Nishimura | 341/154 |
| 5,602,552 A | * | 2/1997 | Hirose et al. | 341/154 |
| 5,714,953 A | * | 2/1998 | Mitani et al. | 341/144 |
| 6,400,298 B1 | * | 6/2002 | Lee | 341/144 |
| 6,501,401 B2 | * | 12/2002 | Van Den Boom et al. | 341/118 |
| 6,621,440 B2 | * | 9/2003 | Gorman | 341/154 |
| 6,924,761 B2 | * | 8/2005 | Jiang et al. | 341/154 |
| 7,372,386 B1 | * | 5/2008 | Maloberti et al. | 341/144 |
| 7,679,538 B2 | * | 3/2010 | Tsang | 341/144 |
| 2002/0047795 A1 | * | 4/2002 | Westra et al. | 341/154 |
| 2010/0097253 A1 | * | 4/2010 | Mu | 341/153 |
| 2011/0241920 A1 | * | 10/2011 | Mori | 341/153 |

FOREIGN PATENT DOCUMENTS

| | | | |
|---|---|---|---|
| JP | 02268524 A | * | 11/1990 |
| JP | 06120835 A | * | 4/1994 |

OTHER PUBLICATIONS

Maloberti, Franco, Data Converters, 2007, pp. 84, 88, 99, 113, Springer.

\* cited by examiner

*Primary Examiner* — Howard Williams
(74) *Attorney, Agent, or Firm* — McDermott Will & Emery LLP

(57) ABSTRACT

Examples of resistive digital-to-analog converter (RDAC) circuits are provided herein. RDAC circuits may provide an analog output signal derived from an n-bit digital input signal. In one example, an RDAC circuit may include a plurality of resistive circuit branches. Each resistive circuit branch may be arranged in a pull up/pull down network configuration. For example, an RDAC circuit may include a plurality of resistive circuit branches positioned in parallel. In an example, each of the plurality of resistive circuit branches may include a first inverter circuit, a second inverter circuit, and a resistive component. The RDAC circuit may include an output node for providing the analog output signal. Additionally, methods are provided for converting an analog output signal derived from an n-bit digital input signal.

26 Claims, 22 Drawing Sheets

| CODE | BINARY REPRESENTATION (B[3:0]) | THERMOMETER REPRESENTATION D[15:0] | NO. OF UNIT RESISTORS SWITCHED TO GND (0V) | NO. OF UNIT RESISTORS SWITCHED TO SUPPLY (1V) | ANALOG OUTPUT VOLTAGE |
|---|---|---|---|---|---|
| 0 | 0000 | 0000000000000000 | 16 | 0 | 0V |
| 1 | 0001 | 0000000000000001 | 15 | 1 | 0.0625V = 1 LSB |
| 2 | 0010 | 0000000000000011 | 14 | 2 | 0.125V |
| 3 | 0011 | 0000000000000111 | 13 | 3 | 0.1875V |
| 4 | 0100 | 0000000000001111 | 12 | 4 | 0.25V |
| 5 | 0101 | 0000000000011111 | 11 | 5 | 0.3125V |
| 6 | 0110 | 0000000000111111 | 10 | 6 | 0.375V |
| 7 | 0111 | 0000000001111111 | 9 | 7 | 0.4375V |
| 8 | 1000 | 0000000011111111 | 8 | 8 | 0.5V |
| 9 | 1001 | 0000000111111111 | 7 | 9 | 0.5625V |
| 10 | 1010 | 0000001111111111 | 6 | 10 | 0.625V |
| 11 | 1011 | 0000011111111111 | 5 | 11 | 0.6875V |
| 12 | 1100 | 0000111111111111 | 4 | 12 | 0.75V |
| 13 | 1101 | 0001111111111111 | 3 | 13 | 0.8125V |
| 14 | 1110 | 0011111111111111 | 2 | 14 | 0.875V |
| 15 | 1111 | 0111111111111111 | 1 | 15 | 0.9375V |

FIG. 14

RESISTIVE DIGITAL-TO-ANALOG CONVERSION

FIELD

The subject technology relates in general to converting digital signals into analog signals, and more particularly to digital-to-analog conversion utilizing resistive components.

BACKGROUND

Digital-to-analog converters typically convert a digital code to an analog signal, for example, a current, voltage, or electric charge. Some digital-to-analog converters have utilized a resistive divider technique containing a switch tree selector and an output buffer. Other digital-to-analog converters have utilized a voltage-mode or current-mode resistive network. However, these digital-to-analog converters are not seen to address the high-speed data and communications bandwidth requirements of contemporary transmitter and/or receiver devices that operate at high speed.

SUMMARY in one aspect of the disclosure, an example of a resistive digital-to-analog converter (RDAC) circuit for providing an analog output signal derived from an n-bit digital input signal is disclosed. Exemplary RDAC circuits comprise a plurality of resistive circuit branches wherein each resistive circuit branch may be arranged in a pull up/pull down network configuration. For example, an exemplary RDAC circuit may comprise a plurality of resistive circuit branches positioned in parallel. Each of the plurality of resistive circuit branches may comprise a first inverter circuit having a resistive circuit branch first end configured to receive a bit input of the n-bit digital input signal, and a second end configured to provide an output of the first inverter circuit, a second inverter circuit having a first end operatively coupled to the second end of the first inverter circuit, and a second end configured to provide an output of the second inverter circuit, and a resistive component having a first end operatively coupled to the second end of the second inverter circuit, and a resistive circuit branch second end configured to provide an output voltage for the bit input. The RDAC circuit may also comprise an output node for providing the analog output signal, the output node may be operatively coupled to each of the resistive circuit branch second ends.

In a further aspect of the disclosure, an example of a fully-differential RDAC circuit is disclosed. An exemplary fully-differential RDAC circuit may comprise a first-side RDAC circuit and a second-side RDAC circuit. According to an aspect, each of the second-side bit inputs may be configured to be a complementary bit input of a corresponding first-side bit input of the n-bit digital input signal. According to another aspect, a first-side output node and a second-side output node may be configured to provide analog output signal.

In yet a further aspect of the disclosure, an example of an interleaved RDAC circuit is disclosed. An exemplary interleaved RDAC circuit may comprise two or more fully-differential RDAC circuits. The interleaved RDAC circuit may comprise a first RDAC circuit, a second RDAC circuit, a first output node Vp, and a second output node Vn. The first RDAC circuit may comprise a plurality of first-side resistive circuit branches, a first node, a first switch, and a second switch. The first RDAC circuit may also comprise a plurality of second-side resistive circuit branches, a second node, a third switch, and a fourth switch. The second RDAC circuit may comprise a plurality of third-side resistive circuit branches, a third node, a fifth switch, and a sixth switch. The second RDAC circuit may also comprise a plurality of fourth-side resistive circuit branches, a fourth node, a seventh switch, and an eighth switch.

In yet a further aspects of the disclosure, methods are provided for converting an analog output signal derived from an n-bit digital input signal.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

FIG. 14 is a table representing an example of coding and analog output values of a side of an exemplary fully-differential resistive digital-to-analog converter, in accordance with certain configurations of the present disclosure.

DETAILED DESCRIPTION

Figure 1A:
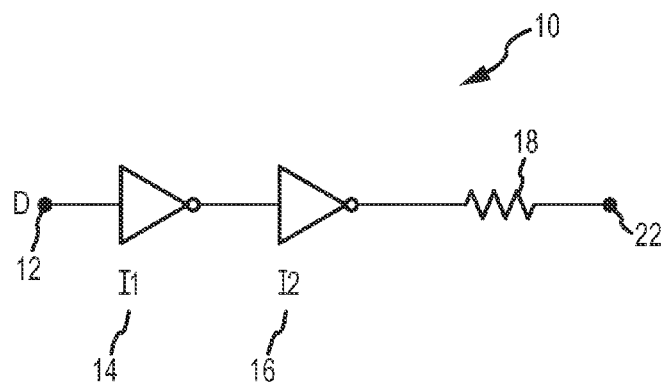
FIGS. 1A-1C are circuit diagrams illustrating examples of resistive circuit branches, in accordance with certain configurations of the present disclosure.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

The word "exemplary" is used herein to mean "serving as an example or illustration." Any aspect or design described herein as "exemplary" is not necessarily to be construed as preferred or advantageous over other aspects or designs.

Various exemplary resistive digital-to-analog converter (RDAC) circuits are described herein. Exemplary RDAC circuits can provide an analog output signal derived from an n-bit digital input signal. In one aspect, an RDAC circuit comprises a plurality of resistive circuit branches and an output node for providing the analog output signal. The plurality of resistive circuit branches may be positioned in parallel, in the sense that each resistive circuit branch first end may receive a bit input and each resistive circuit branch second end may be operatively coupled to the output node. It is to be appreciated that each of the plurality of resistive circuit branches or portion thereof may be generally arranged in a pull up/pull down network configuration. The pull up/pull down network configuration may comprise pulling a resistive component up to one supply voltage or pulling the resistive component down another supply voltage (e.g., GND). Various switching techniques such as, but not limited to, using switching circuits having one or more transistors arranged according to various inverter configurations and switching circuits including one or more NAND gates may be used to pull the resistive component up or down.

For example, each of the plurality of resistive circuit branches may comprise a first inverter circuit, a second inverter circuit, and a resistive component. The first inverter circuit may comprise a first end operatively coupled to a resistive circuit branch first end, and a second end configured to provide an output of the first inverter circuit. The second inverter circuit may comprise a first end operatively coupled to the second end of the first inverter circuit, and a second end configured to provide an output of the second inverter circuit. The resistive component may comprise a first end operatively coupled to the second end of the second inverter circuit, and a resistive circuit branch second end.

In one aspect, the resistive component may be a single unit resistor. Designing a resistive circuit branch with a single unit resistor may have the advantage of reducing the total number of resistive elements required for a particular n-bit RDAC implementation. Fewer resistive elements may result in less space required to build an RDAC and fewer impedance mismatches during operation. Moreover, fewer resistive elements enable strategic placement of the resistive components such that deterministic mismatch errors may be canceled out to the first order.

According to an aspect, the first inverter circuit may operate as the driver and the second inverter circuit may function as the switching circuit to determine whether the resistive component should be switched to one supply voltage or another supply voltage e.g., GND).

In another aspect, a supply voltage to the first inverter circuit may be higher than a supply voltage for the second inverter circuit. In such an overdrive switch configuration, a reduction in switch resistance may be realized.

In yet another aspect, an RDAC circuit implementation may comprise $2^N$ resistive circuit branches, where N may reference the RDAC resolution. According to an aspect of the subject technology, RDAC circuits may be configured to switch resistive components between a supply rail while maintaining a true 50Ω impedance at an output, thereby enabling ultra-high frequency and low-power operation. Accordingly, an output of a side of an RDAC circuit may drive a 50Ω single-ended load. In another aspect, an output of a fully-differential RDAC circuit may drive 100Ω fully-differential load. Moreover, output impedance as seen by a far end device such as, but not limited to, a receiver may remain very accurate and precise independent of the RDAC circuits switching analog outputs between digital codes.

According to yet another aspect, RDAC circuits may comprise calibration circuitry. In some implementations, the calibration circuitry may comprise a static tuning digital-to-analog circuit. In other implementations, the calibration circuitry may comprise an auxiliary resistive ladder digital-to-analog circuit.

In yet another aspect, the first inverter circuit of the resistive circuit branch may comprise a tri-state inverter buffer circuit. The tri-state inverter buffer circuit may be configured to retime data in RDAC configurations at various data rates, particularly high-speed data rates (e.g., above the tens of GHz range) such as but not limited to or 32 Gbps or 64 Gbps. In effect, the tri-state inverter buffer circuit may be similar to placing a latch immediately before the first inverter circuit operating in a regular current steering configuration. An RDAC configuration where the first inverter circuit of each of the plurality of the resistive circuit branches comprises a tri-state inverter buffer circuit may have the advantage of substantially eliminating misaligned data and unwanted spurs.

In yet another aspect, a passive filtering circuit for providing power supply regulation may be operatively coupled to at least some of the plurality of resistive circuit branches. Moreover, in some implementations passive filtering circuits may provide power supply regulation for the first inverter circuit and/or the second inverter circuit. The passive filtering circuit may comprise a second order passive filtering technique. An RDAC configuration where the first inverter circuit and/or the second inverter circuit of at least some of the plurality of the resistive circuit branches may have the advantage of providing substantial power supply regulation in the gigahertz operating range where it is not practical to utilize an active regulator. For example, minimum and maximum output swings of various RDAC circuits may be set by controlling a supply power to the second inverter circuit.

According to some aspects, coding techniques may be employed to segment RDAC circuit configurations whereby a portion of the most significant bits (MSB) may be decoded differently than a portion of the least significant bits (LSB). In some aspects, portioning or segmentation may be utilized to reduce the complexity of digital decoder processing for higher resolution RDAC circuits.

According to certain aspects of the subject technology, various RDAC implementations may be employed in various methods and apparatus including, but not limited to, line driver apparatus, XDSL line drivers, Gigabit Ethernet devices, RF transmitter apparatus, other types of transmitters and data converters. In one aspect, various RDAC implementations may employed in high speed, low power data converters and transmitters.

Aspects of the subject technology may apply the advantage of the rapid shrinking of Complementary Metal Oxide Semiconductor (CMOS) technology whereby more intensive and complex digital processing may be achieved. Some configurations of the subject technology may be very attractive for system-on-chip applications and may be implemented in advanced sub-micron CMOS technology. Moreover, certain aspects of the subject technology may benefit from applying Silicon-On-Insulator (SOI) and/or Silicon-Carbide (SiC) technologies. For example, when SOI technology is applied to aspects of the subject technology, the advantage of replacing bulk junction isolation with an insulator may be realized. However, in some aspects, applications based on bulk CMOS technology may be utilized.

Certain configurations of the RDAC provided in the present disclosure may use Metal Oxide Semiconductor (MOS) or Metal Oxide Semiconductor Field Effect Transistor (MOSFET) technology. In one aspect, the term "field effect transistor (FET)" may refer to any of a variety of multi-terminal transistors generally operating on the principals of controlling an electric field to control the shape and hence the conductivity of a channel of one type of charge carrier in a semiconductor material, including, but not limited to a metal oxide semiconductor field effect transistor (MOSFET), a junction FET (FET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

However, other configurations of the RDAC may utilize bipolar junction transistors (BJT) technology. In one aspect, the term "bipolar junction transistor (BJT)" may refer to any of a variety of multi-terminal transistors generally operating on the principal of carrying current using both electrons and holes, including but not limited to an n-p-n BJH, a p-n-p BJT, and a heterojunction BJT (HBT). In such a configuration, the terms "gate," "source," and "drain" may refer to "base," "emitter," and "collector" of a transistor, respectively.

FIG. 1A is a circuit diagram illustrating an exemplary resistive circuit branch 10. The resistive circuit branch 10 may comprise a first inverter circuit 14 or I1, a second inverter circuit 16 or I2, and a resistive component 18. The first inverter circuit 14 may comprise a resistive circuit branch first end I2 configured to receive a bit input D. In operation, the bit input may be one of a plurality of bits from an n-bit digital input signal to be converted to an analog output signal. Additionally, according to some aspects, the bit input may be latched to the resistive circuit branch first end I2. The inverter circuit 14 may comprise a second end configured to provide an output of the first inverter circuit 14. For example, when the input bit is a "0" or low, the output of the first inverter circuit 14 may produce a "1" or high output. Conversely, when the input bit is a "1" or high, the output of the first inverter circuit 14 may generate a "0" or low output.

The second inverter circuit 16 of the resistive circuit branch 10 may comprise a first end operatively coupled to the second end of the first inverter circuit 14. The first end of the second inverter circuit 16 is configured to receive the output of the first inverter circuit 14. The second inverter circuit 16 may also comprise a second end configured to provide an output of the second inverter circuit 16. For example, when the output of the first inverter circuit 14 is a "1" or high, the output of the second inverter circuit 16 may generate a "0" or low output; and when the output of the first inverter circuit 14 is a "0" or low, the output of the second inverter circuit 16 may generate a "1" or high output.

Still referring to FIG. 1A, a resistive component 18 may comprise a first end operatively coupled to the second end of the second inverter circuit 16. The resistive component 18 may also comprise a resistive circuit branch second end 22. In operation, the resistive circuit branch second end 22 may be configured to provide an output voltage for the bit input D received at the resistive circuit branch first end 12. In one aspect, the resistive component 18 may be a single unit resistor. However, in other aspects, the resistive component 18 may comprise a plurality of resistors or resistive segments arranged in series and/or parallel configurations. In one aspect, one end of such resistors or resistive segments is connected to the output node of the second inverter circuit 16 (or the node X in FIG. 1B), and the other end of such resistors or resistive segments is connected to the resistive circuit branch second end 22. It is to be further noted that certain resistive circuit branch configurations may not require the first inverter circuit 14. For example, aspects of the subject technology may comprise employing a switching configuration such as, but not limited to, the second inverter circuit 16, for pulling the resistive component 18 up or down (e.g., pull up to one supply voltage or pull down to another supply voltage such as GND).

Figure 1B:
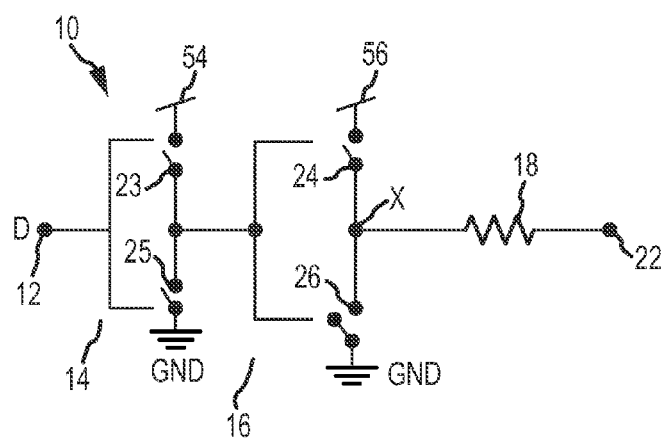

Referring now to FIG. 1B, additional aspects of the exemplary resistive circuit branch 10 are illustrated and described herein. First inverter circuit 14 may comprise a first switch 23 and a second switch 25. The first switch 23 of the first inverter circuit 14 may be configured to be connected to a first supply voltage 54. In an implementation, the first supply voltage may be approximately 1.2V, however, other supply voltage values may be used in various implementations including but not limited to a negative supply voltage. The first switch 23 of the first inverter circuit 14 may comprise a first switch end operatively coupled to the first supply voltage 54 and a second switch end operatively coupled to the second end of the first inverter circuit 14.

The second switch 25 of the first inverter circuit 14 may be configured to be connected to a second supply voltage. In an implementation, the second supply voltage may ground (GND), however, other reference voltages and/or supply voltages may be used in various implementations according to aspects of the subject technology. The second switch 25 of the first inverter circuit 14 may comprise a first switch end operatively coupled to the second end of the first inverter circuit 14 and a second switch end operatively coupled to the second supply voltage.

Still referring to FIG. 1B, second inverter circuit 16 may comprise a first switch 24 and a second switch 26. The first switch 24 of the second inverter circuit 16 may be configured to be connected to a third supply voltage 56. In an implementation, the third supply voltage may be approximately 1.0V, however, other supply voltage values may be used in various implementations including but not limited to a negative supply voltage. The first switch 24 of the second inverter circuit 16 may comprise a first switch end operatively coupled to the third supply voltage 56 and a second switch end operatively coupled to the second end of the second inverter circuit 16.

The second switch 26 of the second inverter circuit may be configured to be connected to a fourth supply voltage. In an implementation, the fourth supply voltage may ground (GND), however, other reference voltages and/or supply voltages may be used in various implementations according to aspects of the subject technology. Moreover, the fourth supply voltage may be the same as the second supply voltage in some implementations. In other implementations, however, the fourth supply voltage may be different than the second supply voltage. The second switch 26 of the second inverter circuit 16 may comprise a first switch end operatively coupled to the second end of the second inverter circuit 16 and a second switch end operatively coupled to the fourth supply voltage. As illustrated in FIG. 1B, the second switch end of the first switch 24 of the second inverter circuit 16 and the first switch end of the second switch 26 of the second inverter circuit 16 may be operatively coupled to node X comprising the output of the second inverter circuit 16. Node X may be operatively coupled to the first end of the resistive component 18. It is to be appreciated that various switch types, configurations, and implementations are contemplated in accordance with the subject technology. For example, according to one aspect, each of the first and second switches 24, 26 may be implemented as a pass gate (e.g., NMOS transistor in parallel with a PMOS transistor). A pass gate configuration may generally require more hardware to drive complementary signals to turn on or off the first and second switches 24, 26 than a configuration having a single transistor for each of the first and second switches 24, 26. According to another aspect, and as illustrated in FIG. 1C and described below, the first switch 24 may be implemented as a single PMOS transistor and the second switch 26 may be implemented as a single NMOS transistor.

Figure 1C:
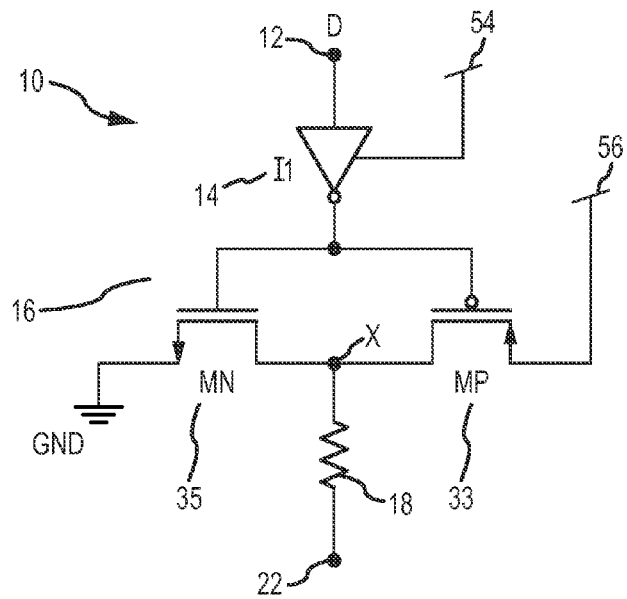

FIG. 1C is a circuit diagram illustrating resistive circuit branch 10 according to an aspect of the subject technology. The second inverter circuit 16 may comprise a first transistor 33 and a second transistor 35. The first transistor 33 may be utilized as the first switch of the second inverter circuit 16 (see, for example, first switch 24 of FIG. 1B). In an implementation, the first transistor 33 may be a PMOS transistor MP or p-channel MOSFET. The second transistor 35 may be utilized as the second switch of the second inverter circuit 16 (see, for example, second switch 26 of FIG. 1B). In an implementation, the second transistor 35 may be an NMOS transistor MN or n-channel MOSFET.

As illustrated in FIG. 1C, the gate terminal of the first transistor 33 may be operatively coupled to the second end of the first inverter circuit 14. Additionally, the output of the first inverter circuit 14 may be inverted. The source terminal of the first transistor 33 may be operatively coupled to the third supply voltage 56, and the drain terminal of the first transistor 33 may be operatively coupled to the second end (node X) of the second inverter circuit 16. The gate terminal of the second transistor 35 may be operatively coupled to the second end of the first inverter circuit 14. The drain terminal of the second transistor 35 may be operatively coupled to the second end (node X) of the second inverter circuit 16, and the source terminal of the second transistor 35 may be operatively coupled to the fourth supply voltage (e.g., GND).

Figure 4:
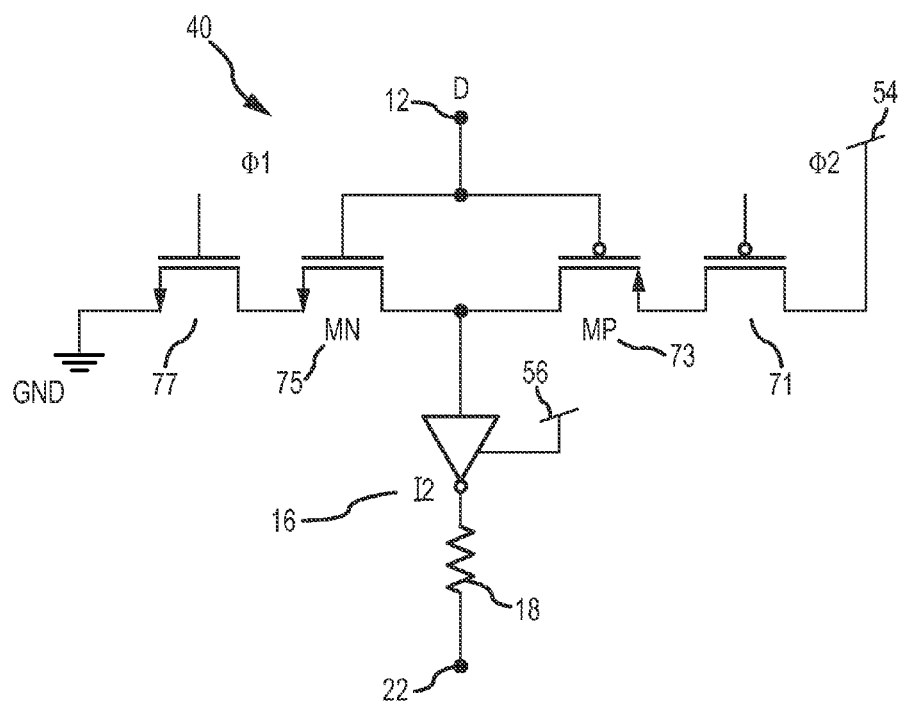
FIG. 4 is a circuit diagram illustrating an example of a resistive circuit branch configured to retime data, in accordance with certain configurations of the present disclosure.

Similarly, as illustrated in FIG. 4, the first inverter circuit 14 may comprise a first transistor 73 and a second transistor 75. The second transistor 73 may be utilized as the first switch of the first inverter circuit 14 (see, for example, first switch 23 of FIG. 1B). In an implementation, the first transistor 73 may be a PMOS transistor MP or p-channel MOSFET. The second transistor 75 may be utilized as the second switch of the first inverter circuit 14 (see, for example, second switch 25 of FIG. 1B). In an implementation, the second transistor 75 may be an NMOS transistor MN or n-channel MOSFET.

In accord with various implementation of the subject technology, the first inverter circuit 14 (I1) and the second inverter circuit 16 (I2) may be sized appropriately to drive the resistive component 18. Referring back to FIGS. 1A to 1C, during operation when the input bit (D) on the resistive circuit branch first end 12 is a "1" or high, the first transistor 33 of the second inverter circuit 16 may pull node X and resistive component 18 to the third supply voltage 56. However, when the input bit (D) on the resistive circuit branch first end 12 is a "0" or low, the second transistor 35 of the second inverter circuit 16 may pull node X and resistive component 18 to the fourth supply voltage (e.g., GND). According to one aspect, when the first switch 24 of the second inverter circuit 16 operates to connect node X to the third supply voltage 56 (for example, when current can flow between the source terminal and drain terminal of the first transistor 33 of the second inverter circuit 16), the second switch 26 of the second inverter circuit 16 may be open (for example, when current cannot flow between the source terminal and drain terminal of the second transistor 35 of the second inverter circuit 16). According to another aspect, when the second switch 26 of the second inverter circuit 16 operates to connect node X to the fourth supply voltage (e.g., GND) (for example, when current can flow between the source terminal and drain terminal of the second transistor 35 of the second inverter circuit 16), the first switch 24 of the second inverter circuit 16 may be open (for example, when current cannot flow between the source terminal and drain terminal of the first transistor 33 of the second inverter circuit 16).

According to another aspect, the first supply voltage 54 may be higher than the third supply voltage 56. For example, the first supply voltage 54 may be approximately 1.2V and the third supply voltage 56 may be approximately 1.0V according to a configuration of the subject technology.

Figure 2:
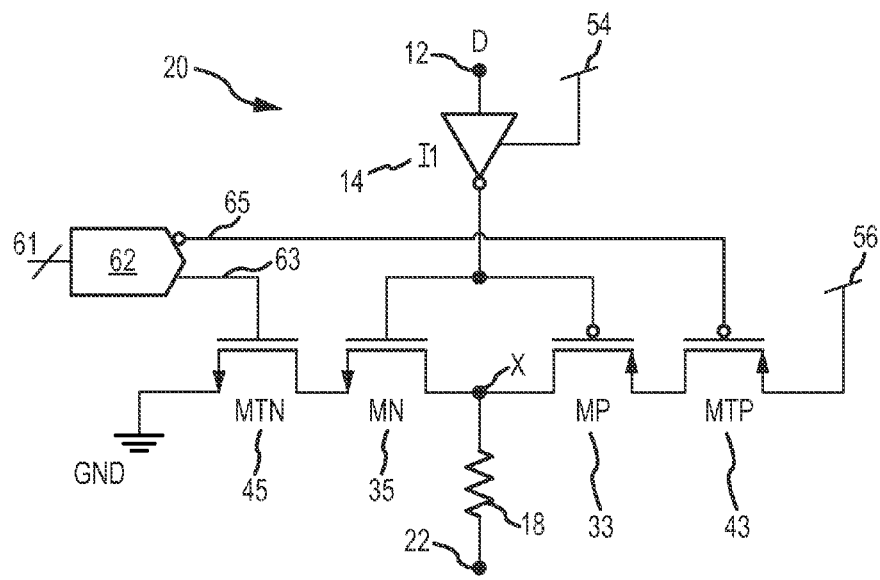
FIG. 2 is a circuit diagram illustrating an example of a resistive circuit branch with static tuning capability, in accordance with certain configurations of the present disclosure.

FIG. 2 illustrates an exemplary resistive circuit branch 20 with tuning capability. In one aspect, the tuning capability of resistive circuit branch 20 may comprise a static tuning digital-to-analog circuit configuration. The second inverter circuit of the resistive circuit branch 20 may comprise calibration a first tuning switch 43 (MTP), a second tuning switch 45 (MTN), and a static tuning digital-to-analog circuit 62. The first tuning switch 43 may be operatively coupled to the first switch or transistor 33 of the second inverter circuit. The first tuning switch 43 may also be operatively coupled to the static tuning digital-to-analog circuit 62. For example, connection 65 of the static tuning digital-to-analog circuit 62 may be operatively coupled to a gate terminal of the first tuning switch 43. A source terminal of the first tuning switch 43 may be operatively coupled to the third supply voltage 56 and a drain terminal of the first tuning switch 43 may be operatively coupled to the source terminal of the first transistor 33.

The second tuning switch 45 may be operatively coupled to the second switch or transistor 35 of the second inverter circuit. The second tuning switch 45 may also be operatively coupled to the static tuning digital-to-analog circuit 62. For example, connection 63 of the static tuning digital-to-analog circuit 62 may be operatively coupled to a gate terminal of the second tuning switch 45. A source terminal of the second tuning switch 45 may be operatively coupled to the fourth supply voltage (e.g., GND) and a drain terminal of the second tuning switch 45 may be operatively coupled to the source terminal of the second transistor 35.

Still referring to FIG. 2, the static tuning digital-to-analog circuit 62 may be operable to receive tuning codes from a calibration engine. In an aspect, the first and second tuning switches 43, 45 may be configured to operate in a current starved mode. Accordingly, the second inverter circuit of resistive circuit branch 20 may be operated in a current starved architecture to facilitate tuning or calibration of an RDAC configuration.

Figure 3:
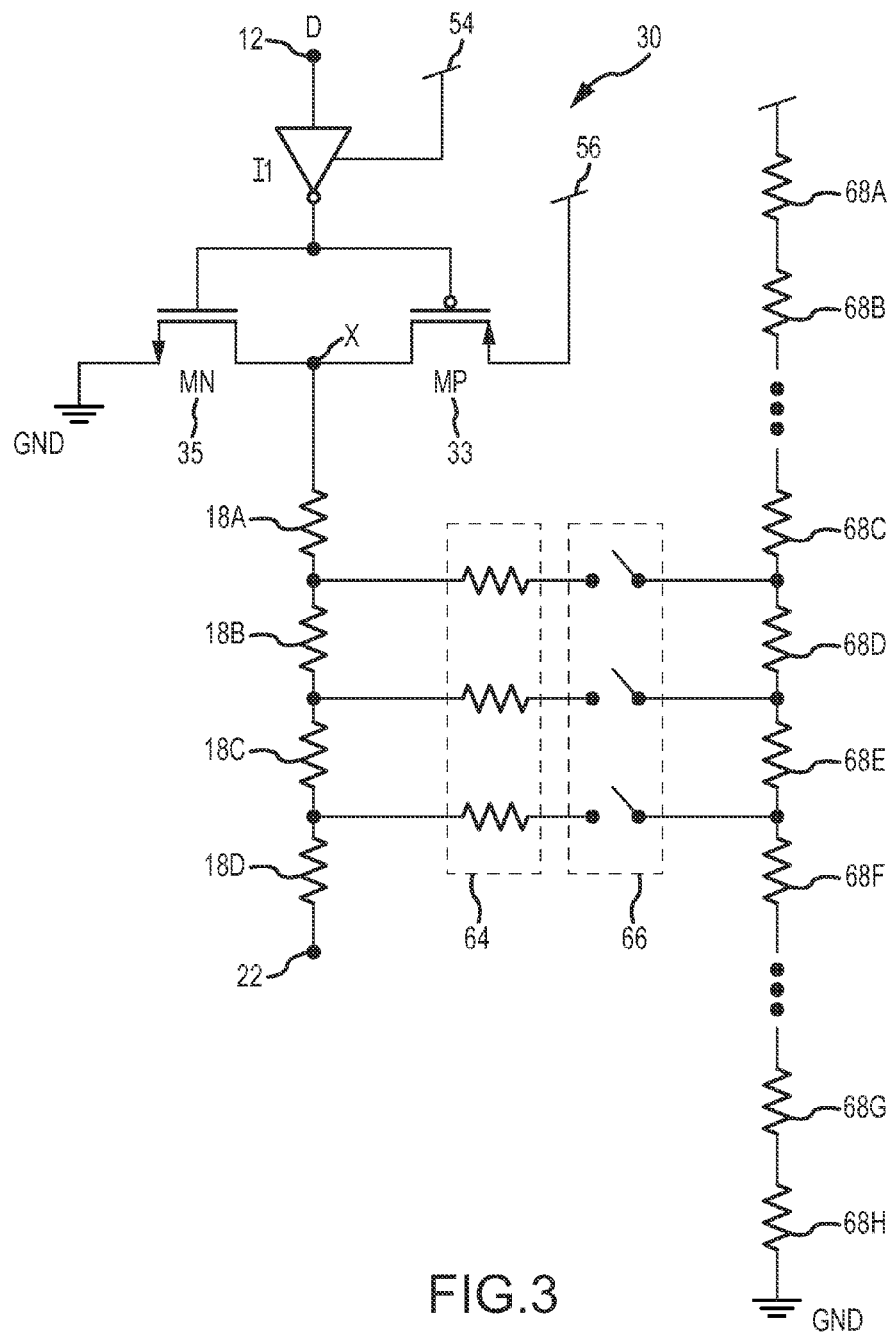
FIG. 3 is a circuit diagram illustrating an example of a resistive circuit branch with auxiliary resistive ladder tuning capability, in accordance with certain configurations of the present disclosure.

FIG. 3 illustrates an exemplary resistive circuit branch 30 with tuning capability according to another aspect. Tuning capability of resistive circuit branch 30 may comprise an auxiliary resistive ladder digital-to-analog circuit configuration. The second inverter circuit of the resistive circuit branch 30 may comprise an auxiliary resistive ladder digital-to-analog circuit and a segmented resistive component. The segmented resistive component may comprise two or more resistive segments 18 A-D. In one aspect, each of the two or more resistive segments 18 A-D may be equal segments. Nodes between at least some of the two or more resistive segments 18 A-D may be operatively coupled to two or more tuning resistors 64. The two or more tuning resistors 64 may be operatively coupled to two or more calibration switches 66, which may be operatively coupled to nodes between at least some of the plurality of resistors 68A-H. The plurality of resistors 68A-H comprising the auxiliary resistive ladder digital-to-analog circuit may be generally configured in series operatively coupled to a first auxiliary supply voltage (e.g., a supply proximal resistor 68a) and a second auxiliary supply voltage (e.g., a supply or GND proximal resistor 68h). According to an aspect, the two or more calibration switches 66 may be operable to receive tuning codes from a calibration engine. Accordingly, the second inverter circuit of resistive circuit branch 30 may be configured to tune or calibrate the resistive component 18 comprising two or more resistive segments 18 A-D of an RDAC configuration. It is to be understood that in some aspects, the resistance values of the two of more tuning resistors 64 and the plurality of resistors 68A-H comprising the auxiliary resistive ladder digital-to-analog circuit may be larger than the resistance values of the two or more resistive segments 18 A-D.

FIG. 4 illustrates exemplary resistive circuit branch 40 configured to retime data of various RDAC configurations. In one aspect, the first inverter circuit of the resistive circuit branch 40 may comprise a tri-state inverter buffer circuit. The tri-state inverter buffer circuit may be configured to operate with clocking signals at various rates such as, but not limited to, a 32 GHz clocking signal or a 64 GHz clocking signal. The first inverter circuit of resistive circuit branch 40 may comprise a first retiming switch 71 and a second retiming switch 77. The first retiming switch 71 may be configured to receive a first retimed clocking signal Φ1 and the second reaming switch 77 configured to receive a second retimed clocking signal Φ2.

In one configuration, the first retiming switch 71 may be operatively coupled to the first switch or transistor 73 of the first inverter circuit. For example, the second retimed clocking signal Φ2 may be operatively coupled to a gate terminal of the first retiming switch 71. A source terminal of the first reaming switch 71 may be operatively coupled to the first supply voltage 54 and a drain terminal of the first retiming switch 71 may be operatively coupled to the source terminal of the first transistor 73 of the first inverter circuit. The second retiming switch 77 may be operatively coupled to the second switch or transistor 75 of the first inverter circuit. For example, the first retimed clocking signal Φ1 may be operatively coupled to a gate terminal of the second retiming switch 77. A source terminal of the second retiming switch 77 may be operatively coupled to the second supply voltage (e.g., GND) and a drain terminal of the second retiming switch 77 may be operatively coupled to the source terminal of the second transistor 75 of the first inverter circuit.

Figure 5:
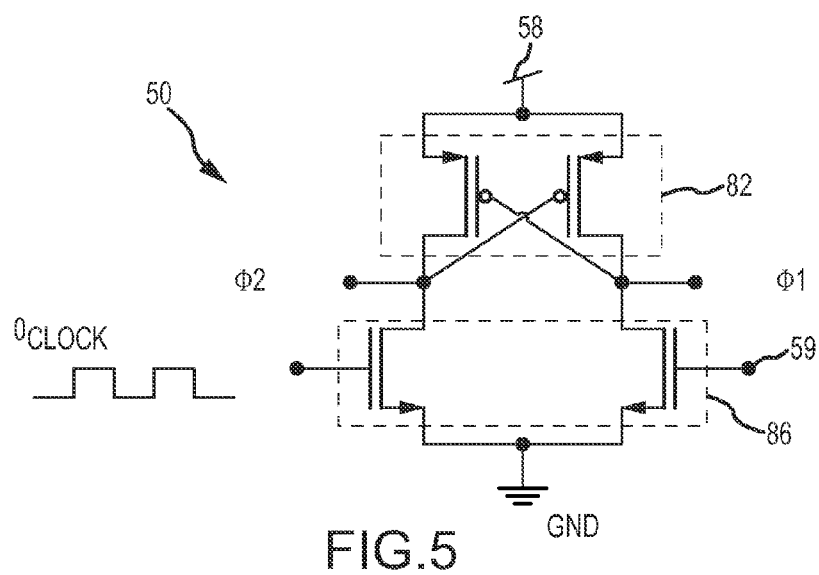
FIG. 5 is a circuit diagram illustrating an example of a retiming latch circuit for providing clocking to retime data, in accordance with certain configurations of the present disclosure.

FIG. 5 shows an exemplary retiming latch circuit 50 for providing clocking to retime data. The retiming latch circuit 50 may be used for providing the first and second retimed clocking signals Φ1, Φ2 from a clocking source Φclock. The retiming latch circuit 50 may comprise a PMOS latch circuit 82 and an NMOS input differential pair circuit 86. The retiming latch circuit 50 may also be operatively coupled to fifth supply voltage 58 and a sixth supply voltage (e.g., GND). In one implementation, node 59 of the NMOS input differential pair circuit 86 may be operatively coupled to a reference supply voltage of Vdd/2. While returning or realignment of data may be facilitated by retiming latch circuit 50 or similar positive retiming latch circuits, it is to be appreciated that other retiming latch circuits and techniques may be used in various configurations of the RDAC. For example, in one alternative implementation, the retiming latch circuit may include a configuration using an NMOS latch and PMOS input differential pairs.

Figure 6:
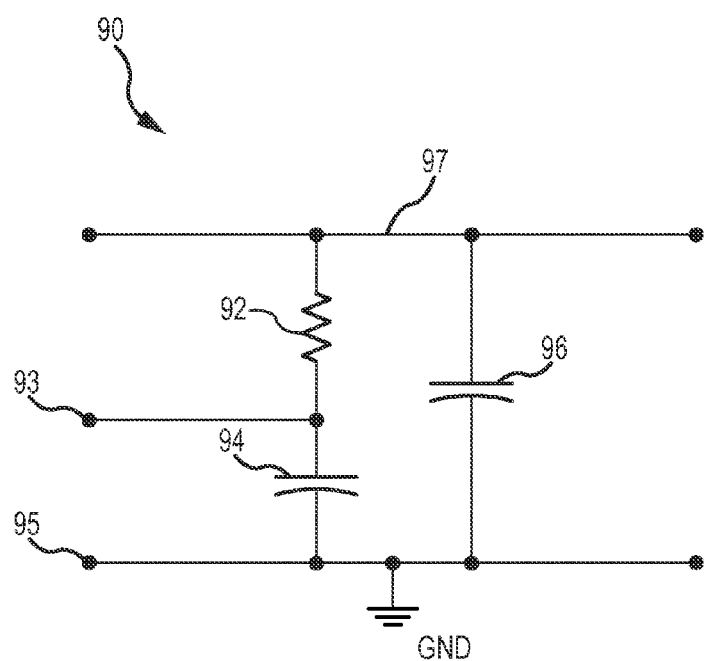
FIG. 6 is a circuit diagram illustrating an example of a passive filtering circuit for providing power supply regulation, in accordance with certain configurations of the present disclosure.

FIG. 6 shows an exemplary passive filtering circuit 90 for providing power supply regulation. Passive filtering circuit 90 may be operatively coupled to at least some of the plurality of resistive circuit branches, in one aspect, the passive filtering circuit 90 may comprise a second order passive filtering technique. The passive filtering circuit 90 may be comprise a resistor 92, a first capacitor 94, and a second capacitor 96. The first and second capacitors 94, 96 may comprise a deep trench (DT) capacitor and metal-insulator-metal (MIM) capacitor combination. In some implementations, the value of capacitors 94, 96 may be in the nanofarads range. Passive filtering circuit 90 may be configured to provide a regulated supply voltage via nodes 93 and 95 when a voltage source Vdd is provided via connection 97.

In one implementation, a first passive filtering circuit 90 may provide power supply regulation for the switches in the first inverter circuit. In another implementation, a second passive filtering circuit 90 may provide power supply regulation for the switches in the second inverter. As described above, the first and second inverter circuits may operate at different voltage levels. Accordingly, different passive filtering circuits may be used. With reference to the passive filtering circuit 90 in FIG. 6 and resistive circuit branch 10 of FIG. 1B, the first passive filtering circuit may be configured to provide the first supply voltage 54 via node 93 and the second supply voltage (e.g., GND) via node 95. The second passive filtering circuit 90 may be configured to provide the third supply voltage 56 via node 93 and the fourth supply voltage (e.g., GND) via node 93.

Figure 7:
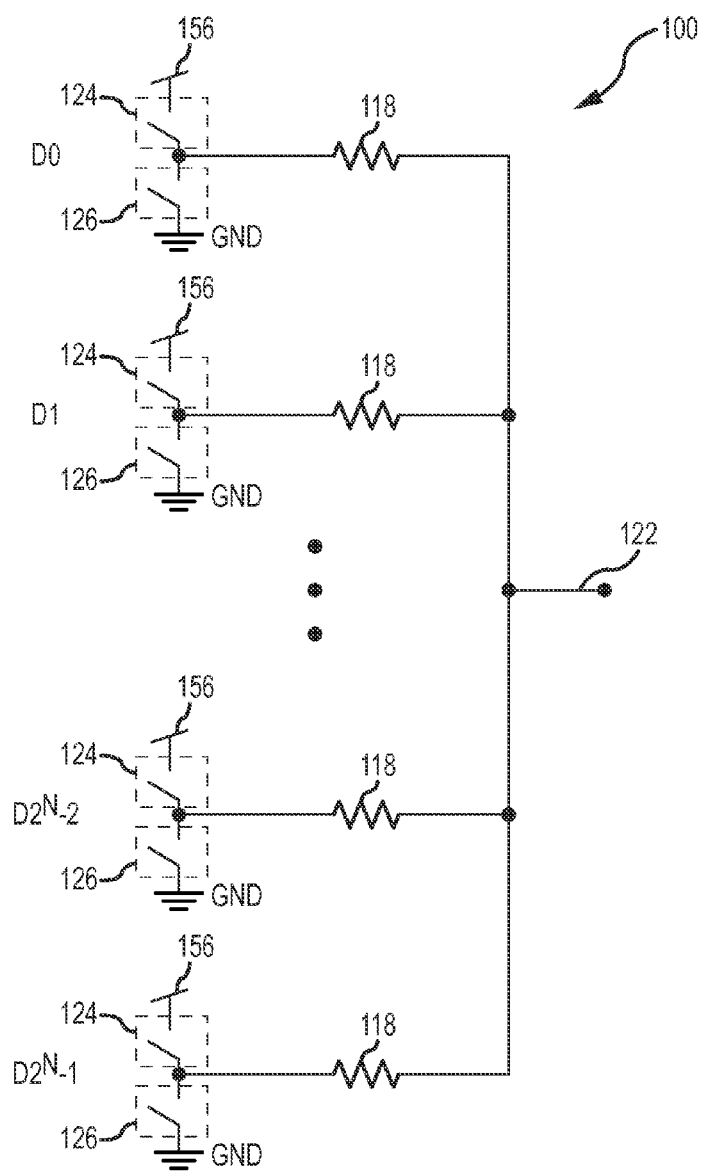
FIG. 7 is a circuit diagram of an example of a single-ended resistive digital-to-analog converter, in accordance with certain configurations of the present disclosure.

FIG. 7 is a circuit diagram of an exemplary single-ended RDAC circuit 100. It is to be appreciated that the various aspects and features discussed with respect to the various resistive circuit branch implementations may be applied alone or in combination with the various RDAC configurations described herein. The single-ended RDAC circuit 100 may provide an analog output signal derived from an n-bit digital input signal, RDAC circuit 100 may comprise a plurality of resistive circuit branches and an output node 122. Each of the plurality of resistive circuit branches may be configured accord with the implementations described above. FIG. 7 illustrates an exemplary arrangement of some components thereof. The plurality of resistive circuit branches may be configured in parallel. Each bit input $D0, D1, \ldots, D2^N-1$ of a corresponding bit input of the n-bit digital input signal may be received by a resistive circuit branch first end. The first inverter circuit (not shown) may comprise the resistive circuit branch first end and a second end configured to provide an output of the first inverter circuit. The second inverter circuit may comprise a first end operatively coupled to the second end of the first inverter circuit, and a second end configured to provide an output of the second inverter circuit. As illustrated in FIG. 7, the second inverter circuit may comprise a first switch 124 operatively coupled to a third supply voltage 156 and a second switch 126 operatively coupled to a fourth supply voltage (e.g., GND). The resistive component 118 may comprise a first end operatively coupled to the second end of the second inverter circuit, and a resistive circuit branch second end configured to provide an output voltage for the corresponding bit input. The output node 122 may be operatively coupled to each of the resistive circuit branch second ends and configured to provide the analog output signal of RDAC 100.

Figure 11:
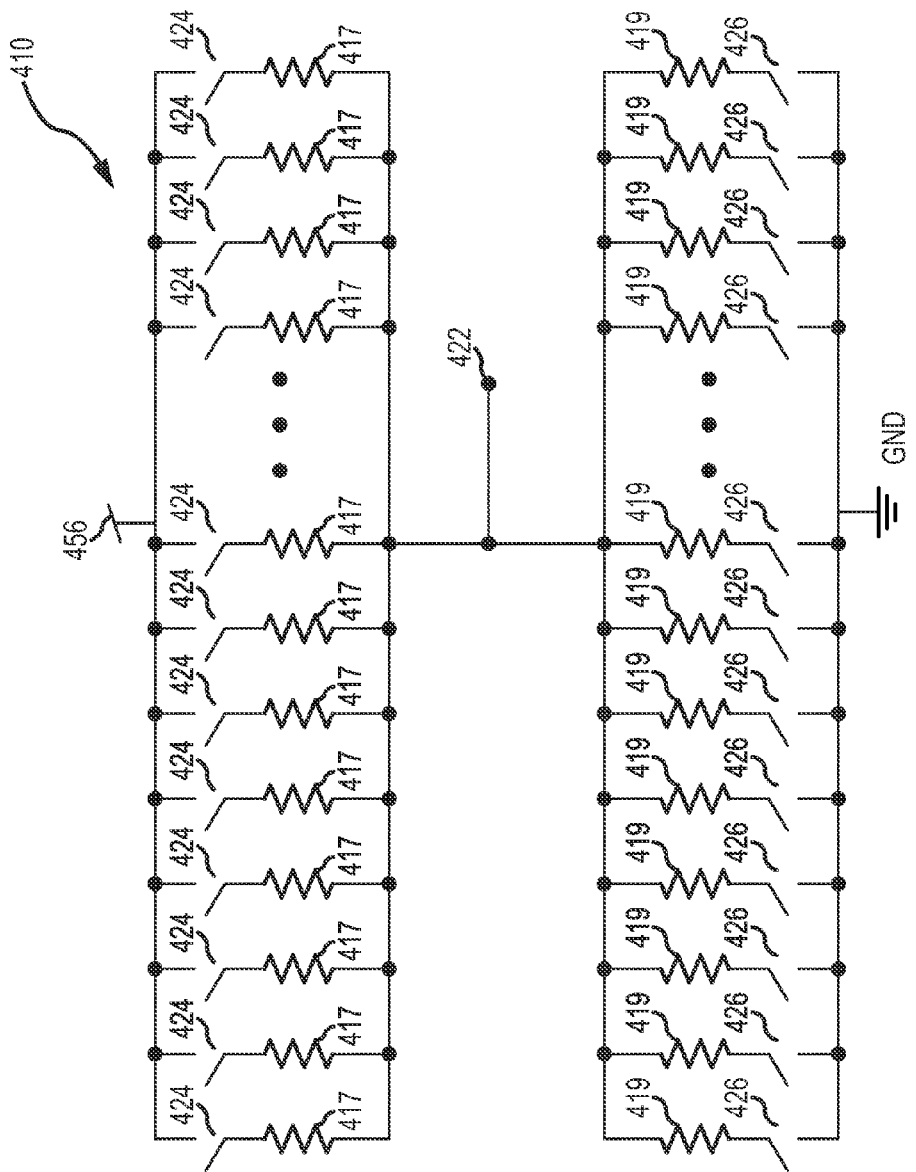
FIG. 11 is a circuit diagram of an example of a single-ended resistive digital-to-analog converter having at least two resistive segments on a resistive circuit branch, in accordance with certain configurations of the present disclosure.

Now referring ahead to FIG. 11 for a time being, a circuit diagram of an exemplary single-ended RDAC circuit 410 having at least two resistive segments on a resistive circuit branch is illustrated. The first inverter circuit (not shown) may comprise the resistive circuit branch first end and a second end configured to provide an output of the first inverter circuit. The second inverter circuit may comprise a first end operatively coupled to the second end of the first inverter circuit, and a second end configured to provide an output of the second inverter circuit. As illustrated in FIG. 11, the second inverter circuit may comprise a first switch 424 operatively coupled to a third supply voltage 456 and a second switch 426 operatively coupled to a fourth supply voltage (e.g., GND). The first resistive component may comprise a first resistive segment 417 and a second resistive segment 419. The first resistive segment 417 may comprise a first end operatively coupled to the first switch 424, and may be coupled to a resistive circuit branch second end configured to provide an output voltage for the corresponding bit input. The second resistive segment 419 may comprise a first end operatively coupled to the second switch 426, and may be coupled to the resistive circuit branch second end configured to provide an output voltage for the corresponding bit input. The output node 422 may be operatively coupled to each of the resistive circuit branch second ends and configured to provide the analog output signal of RDAC 410. However, as compared to the RDAC circuit implementation of FIG. 7 and other disclosed configuration, RDAC 410 may require twice as many unit resistors.

Figure 8:
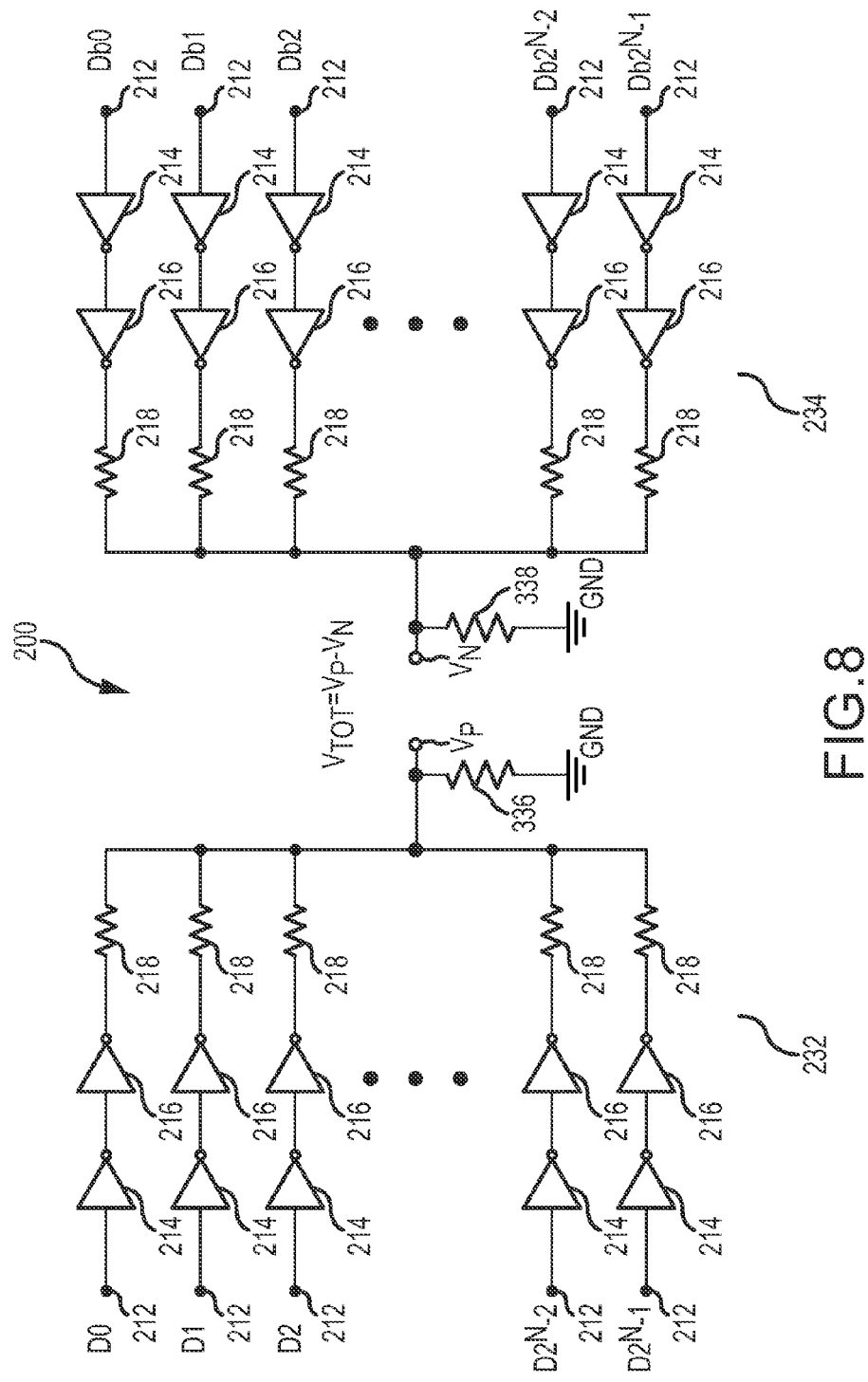
FIG. 8 is a circuit diagram illustrating an example of a fully-differential resistive digital-to-analog converter, in accordance with certain configurations of the present disclosure.

Now referring to FIG. 8, an exemplary fully-differential RDAC circuit 200 is illustrated. The fully-differential RDAC circuit 200 may provide an analog output signal derived from an n-bit digital input signal. It is to be appreciated that RDAC circuit 200 may be sized to support $D2^N-1$ bit inputs as illustrated, however, may also be sized with any integer number of bit inputs in some implementations. The RDAC circuit 200 may comprise a first-side RDAC circuit 232 and a second-side RDAC circuit 234. The first-side RDAC circuit 232 may comprise a plurality of first-side resistive circuit branches and a first-side output node Vp. Each of the plurality of first-side resistive circuit branches may comprise a first-side first inverter circuit 214 having a first-side resistive circuit branch first end 212. The first-side resistive circuit branch first end 212 may be configured to receive a first-side bit input, for example, a one of $D0, D2, D3, \ldots, D2^N-1$. Each of the plurality of first-side resistive circuit branches may also comprise a first-side second inverter circuit 216 and a first-side resistive component 218. The first-side resistive component 218 may comprise a first-side resistive circuit branch second end configured to provide an output voltage for the first-side bit input. Each of the first-side resistive circuit branch second ends may be operatively coupled to the first-side output node Vp. It is to be appreciated that the first-side resistive circuit branches in RDAC circuit 200 may be configured as described above including the various aspects and configurations associated with the exemplary resistive circuit branches disclosed herein. The RDAC circuit 200 may also comprise a load resistive component 336 operatively coupled to the first-side output node Vp. A first end of the load resistive component 336 may be operatively coupled to the first-side output node Vp and a second end of the load resistive component 336 may be operatively coupled to ground (or a particular supply voltage or reference voltage).

Still referring to FIG. 8, the second-side RDAC circuit 234 may comprise a plurality of second-side resistive circuit branches and a second-side output node Vn. Each of the plurality, of second-side resistive circuit branches may comprise a second-side first inverter circuit 214 having a second-side resistive circuit branch first end 212. The second-side resistive circuit branch first end 212 may be configured to receive a second-side bit input, for example, a one of $Db0, Db2, Db3, \ldots, Db2^N-1$. According to an aspect, the second-side bit inputs may be configured to be a complementary bit input of a corresponding first-side bit input of the n-bit digital input signal. Each of the plurality of second-side resistive circuit branches may also comprise a second-side second inverter circuit 216 and a second-side resistive component 218. The second-side resistive component 218 may comprise a second-side resistive circuit branch second end configured to provide an output voltage for the second-side bit input. Each of the second-side resistive circuit branch second ends may be operatively coupled to the second-side output node Vn. It is to be appreciated that the second-side resistive circuit branches in RDAC circuit 200 may be configured as described above including the various aspects and configurations associated with the exemplary resistive circuit branches disclosed herein. The RDAC circuit 200 may also comprise a second-side load resistive component 338 operatively coupled to the second-side output node Vn. A first end of the load resistive component 336 may be operatively coupled to the second-side output node Vn and a second end of the load resistive component 338 may be operatively coupled to ground (or a particular supply voltage or reference voltage). In operation, the first-side output node Vp and the second-side output node Vn may be configured to provide the analog output signal (e.g., Vtot=Vp−Vn) for the RDAC circuit 200. According to an aspect, the first-side output node Vp and the second-side output node Vn may provide a 100Ω external load.

Figure 9:
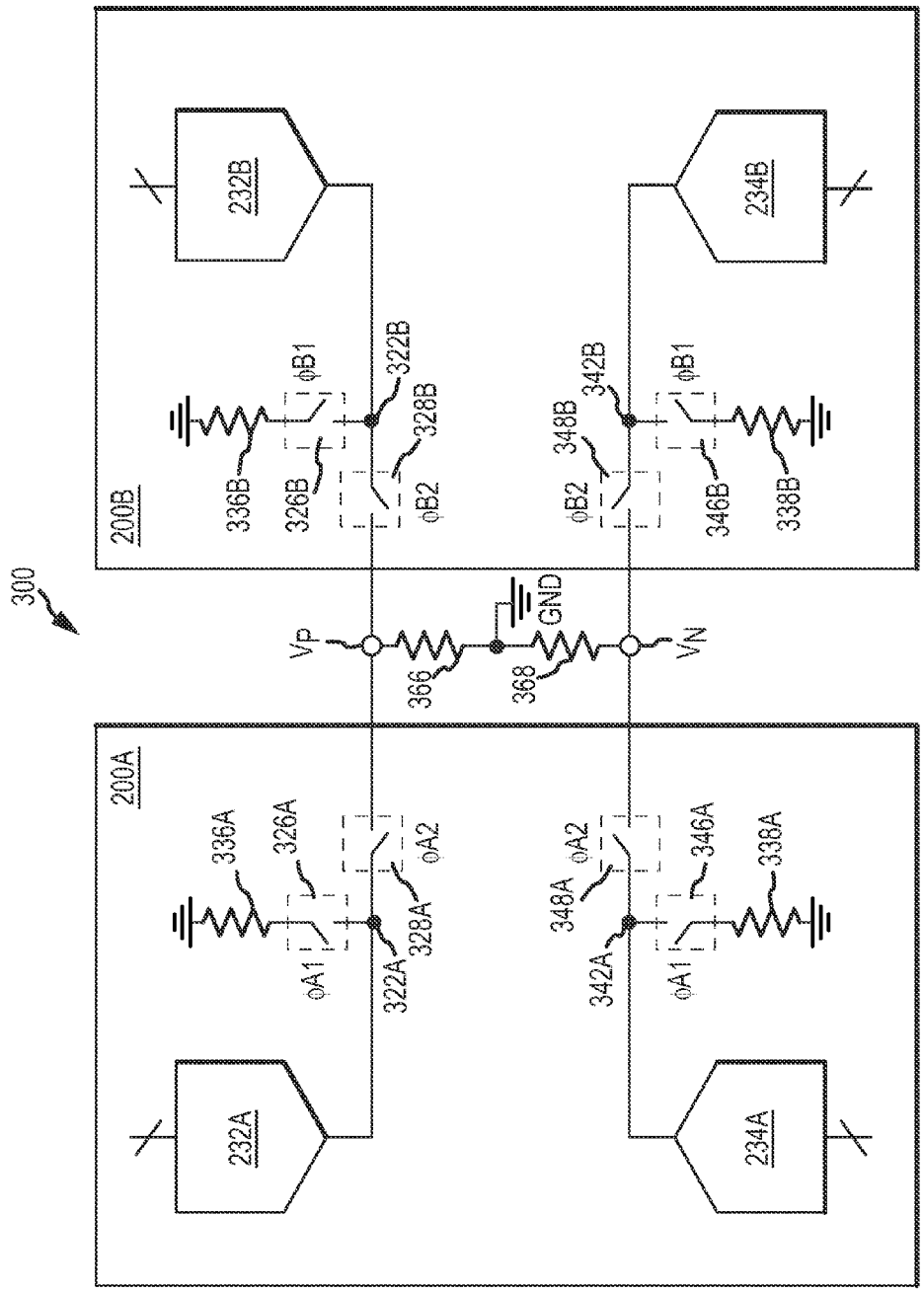
FIG. 9 is a circuit diagram illustrating an example of a interleaved resistive digital-to-analog converter, in accordance with certain configurations of the present disclosure.

FIG. 9 is a circuit diagram illustrating an exemplary interleaved RDAC circuit 300. Interleaved RDAC circuit 300 may comprise two or more fully-differential RDAC circuits. The two or more fully-differential RDAC circuits may be interleaved or parallelized for high-speed applications. An interleave-by-2 RDAC circuit configuration is provided in FIG. 9, however, it is to be appreciated that the interleaving architecture disclosed herein may be extended to a larger number of RDAC circuit configurations. In one aspect, an interleave-by-N may be implemented according to the present disclosure where each fully-differential RDAC circuit may be an X Gbps RDAC circuit with N such RDAC circuits to provide a NX Gbps interleaved RDAC circuit. According to an aspect, an interleaved RDAC circuit may require at least two phases of clocks and may be seen as performing a return-to-zero operation. In some implementations, this return-to-zero operation may help reduce any inter symbol interference (ISI) effects.

RDAC circuit 300 may provide an analog output signal derived from an n-bit digital input signal. RDAC circuit 300 may comprise a first RDAC circuit 200*a*, a second RDAC circuit 200*b*, a first output node Vp, and a second output node Vn. The first RDAC circuit 200*a* may comprise a plurality of first-side resistive circuit branches 232*a*, a first node 322*a*, a first switch 326*a*, and a second switch 328*a*. Each of the plurality of first-side resistive circuit branches 232*a* may comprise a resistive circuit branch first end configured to receive a first-side bit input from the n-bit digital input signal and a resistive circuit branch second end configured to provide an output voltage for the first-side hit input. The first node 322*a* may be operatively coupled to the resistive circuit branch second end of each of the plurality of first-side resistive circuit branches. The first switch 326*a* may comprise a first end operatively coupled to the first node 322*a* and a second end operatively coupled to a first resistor 336*a*. The second switch 328*a* may comprise a first end operatively coupled to the first node 322*a* and a second end.

Still referring to FIG. 9, the first RDAC circuit 200*a* may also comprise a plurality of second-side resistive circuit branches 234*a*, a second node 342*a*, a third switch 346*a*, and a fourth switch 348*a*. Each of the plurality of second-side resistive circuit branches 234*a* may comprise a resistive circuit branch first end configured to receive a second-side bit input and a resistive circuit branch second end configured to provide an output voltage for the second-side bit input. The second node 342*a* may be operatively coupled to the resistive circuit branch second end of each of the second plurality of resistive circuit branches. The third switch 346*a* may comprise a first end operatively coupled to the second node 342*a* and a second end operatively coupled to a second resistor 338*a*. The fourth switch 348*a* may comprise a first end operatively coupled to the second node 342*a* and a second end.

The second RDAC circuit 200*b* may comprise a plurality of third-side resistive circuit branches 232*b*, a third node 322*b*, a fifth switch 326*b*, and a sixth switch 328*b*. Each of the plurality of third-side resistive circuit branches 232*h* may comprise a resistive circuit branch first end configured to receive a third-side hit input from the n-bit digital input signal and a resistive circuit branch second end configured to provide an output voltage for the third-side bit input. The third node 322*b* may be operatively coupled to the resistive circuit branch second end of each of the plurality of third-side resistive circuit branches. The fifth switch 326*b* may comprise a first end operatively coupled to the third node 322*b* and a second end operatively coupled to a third resistor 336*b*. The sixth switch 328*b* may comprise a first end operatively coupled to the third node 322*b* and a second end.

With continued reference to FIG. 9, the second RDAC circuit 200*b* may also comprise a plurality of fourth-side resistive circuit branches 234*b*, a fourth node 342*b*, a seventh switch 346*b*, and an eighth switch 348*b*. Each of the plurality of fourth-side resistive circuit branches 234*b* may comprise a resistive circuit branch first end configured to receive a fourth-side bit input and a resistive circuit branch second end configured to provide an output voltage for the fourth-side bit input. The fourth node 342*b* operatively coupled to the resistive circuit branch second end of each of the plurality of fourth-side resistive circuit branches. The seventh switch 346*b* may comprise a first end operatively coupled to the fourth node 342*b* and a second end operatively coupled to a fourth resistor 338*b*. The eighth switch 348*b* may comprise a first end operatively coupled to the fourth node 342*b* and a second end.

Still referring to FIG. 9, the first output node Vp of RDAC circuit 300 may be operatively coupled to the second end of the second switch 328*a* and the second end of the sixth switch 328*b*. Similarly, the second output node Vn of RDAC circuit 300 may be operatively coupled to the second end of the fourth switch 348*a* and the second end of the eight switch 348*b*. According to an aspect, the first output node Vp and the second output node Vn may provide a 100Ω external load.

According to an aspect, each of the second-side bit inputs may be configured to be a complementary bit input of a corresponding first-side bit input, and each of the fourth-side bit inputs may be configured to be a complementary bit input of a corresponding third-side bit input. In another aspect, at least one of the plurality of first-side resistive circuit branches, the plurality of second-side resistive circuit branches, the plurality of third-side resistive circuit branches, and the plurality of fourth-side resistive circuit branches may comprise a resistive circuit branch configuration as described above with respect to exemplary resistive circuit branch 10.

Figure 10:
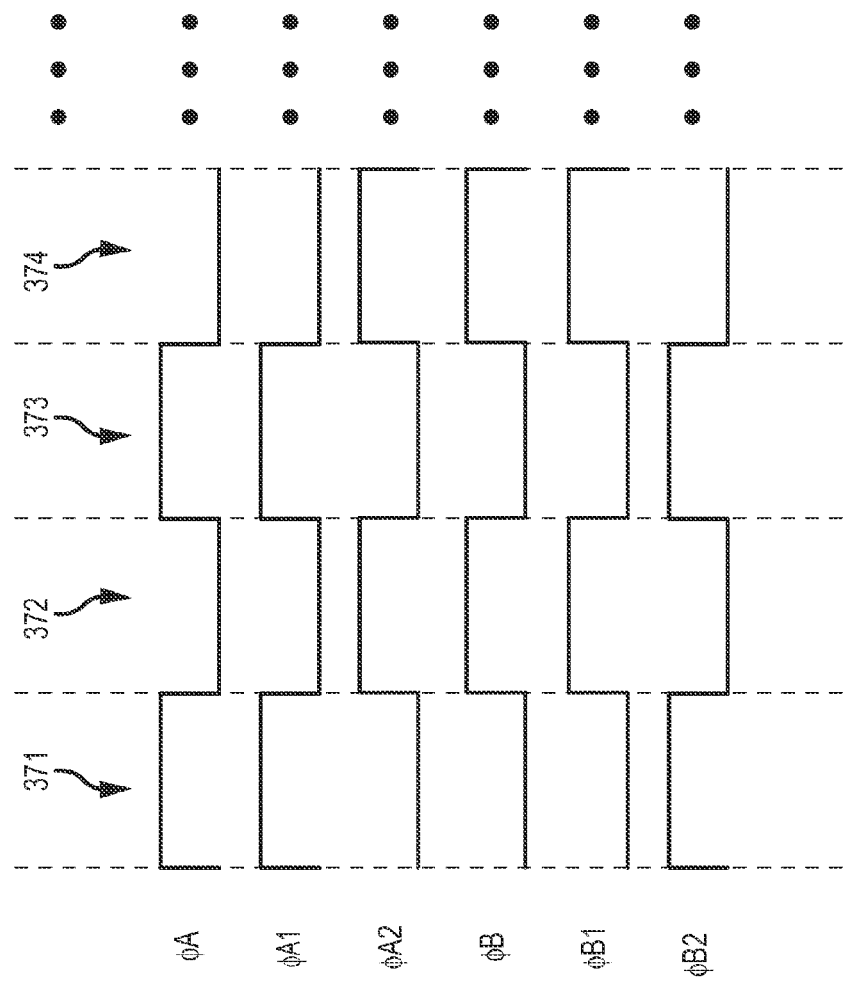
FIG. 10 is a clocking diagram illustrating an example of clocking signals for use with an exemplary interleaved resistive digital-to-analog converter, in accordance with certain configurations of the present disclosure.

FIG. 10 is a clocking diagram illustrating exemplary clocking signals. Clocking durations may comprise a first clocking duration 371, a second clocking duration 372, a third clocking duration 373, and a fourth clocking duration 374. An exemplary operation of RDAC circuit 300 may be described with reference to the clocking diagram and FIGS. 22 and 23. In an aspect, clocking designations ΦA and ΦB may represent the clocks that latch data into the first RDAC circuit 200*a* and the second RDAC circuit 200*b*, respectively. Note that FIGS. 23 and 22 are described below ahead of FIG. 12 for mere convenience.

Figure 23:
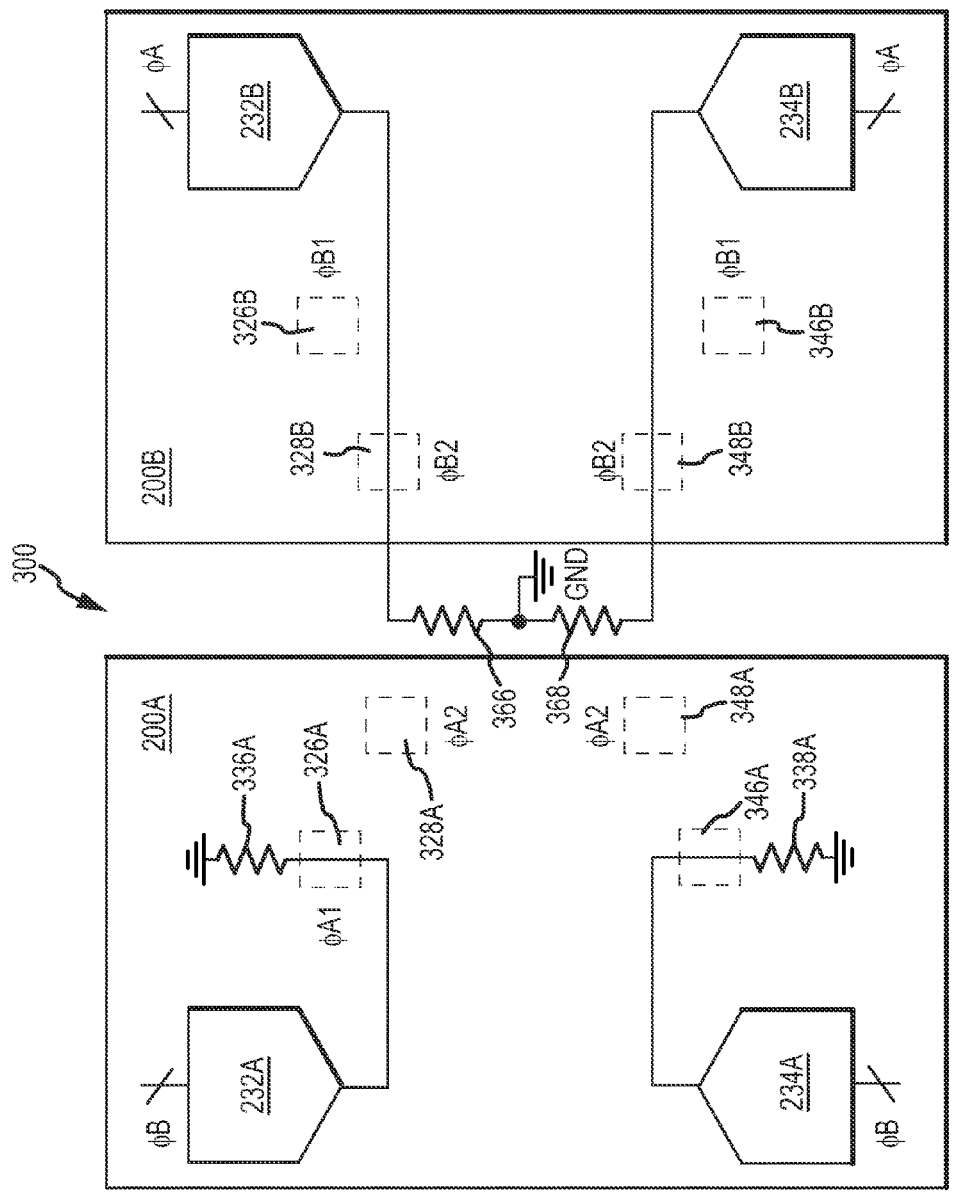
FIG. 23 is a circuit diagram illustrating an example of an interleaved resistive digital-to-analog converter during a clocking duration, in accordance with certain configurations of the present disclosure.

FIG. 23 is a circuit diagram illustrating RDAC circuit 300 during the first clocking duration 371. For example, the first switch 326*a*, the third switch 346*a*, the sixth switch 328*b*, and the eight switch 348b may be configured to be turned on during the first clocking duration 371. Additionally, the second switch 328a, the fourth switch 348a, the fifth switch 326b, and the seventh switch 346b may be configured to be turned off during the first clocking duration 371.

Figure 22:
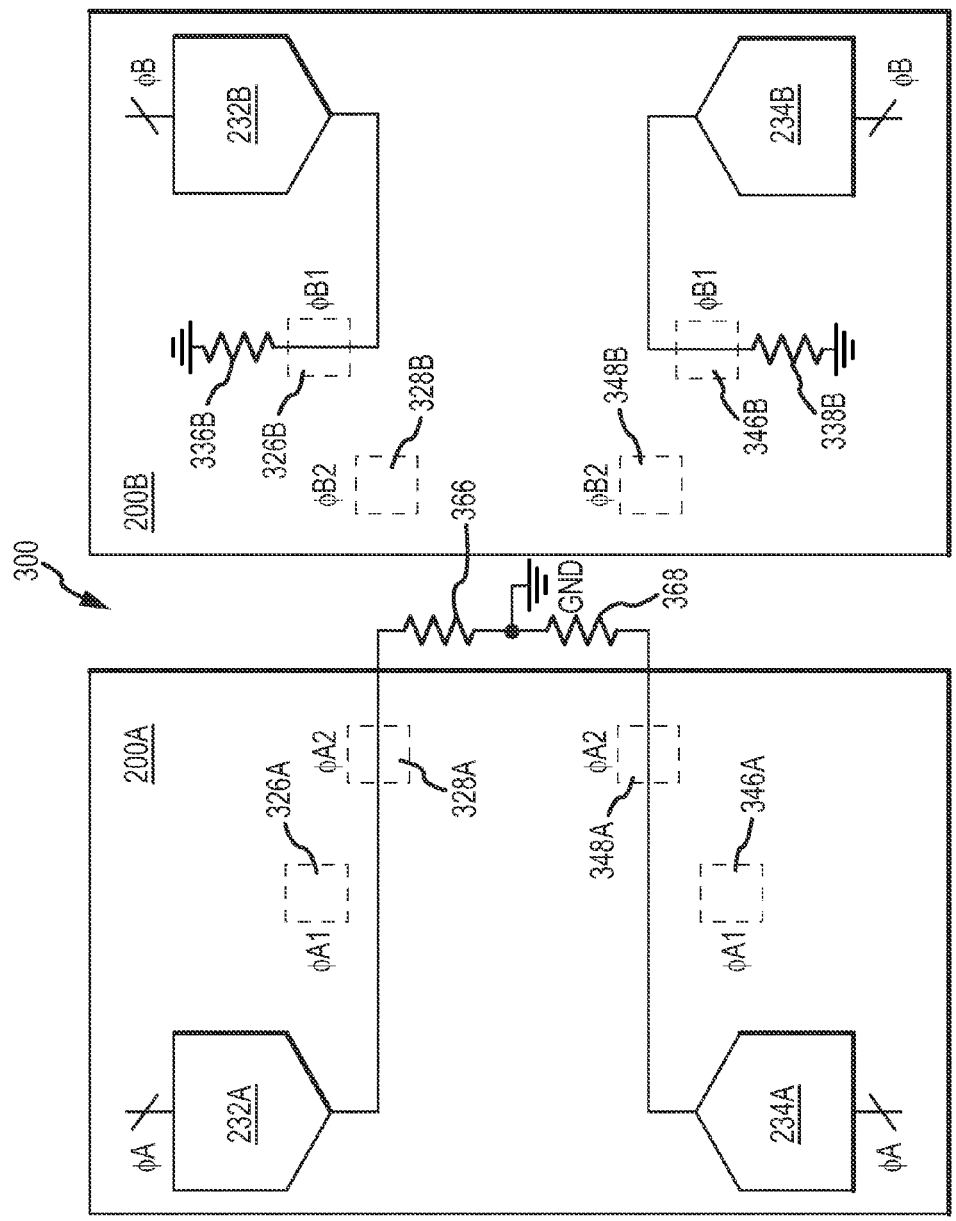
FIG. 22 is a circuit diagram illustrating an example of an interleaved resistive digital-to-analog converter during a clocking duration, in accordance with certain configurations of the present disclosure.

FIG. 22 is a circuit diagram illustrating RDAC circuit 300 during the second clocking duration 372. For example, the second switch 328a, the fourth switch 348a, the fifth switch 326b, and the seventh switch 346b may be configured to be turned on during a second clocking duration 372. Additionally, the first switch 326a, the third switch 346a, the sixth switch 328b, and the eight switch 348b may be configured to be turned off during the second clocking duration 372.

Figure 12:
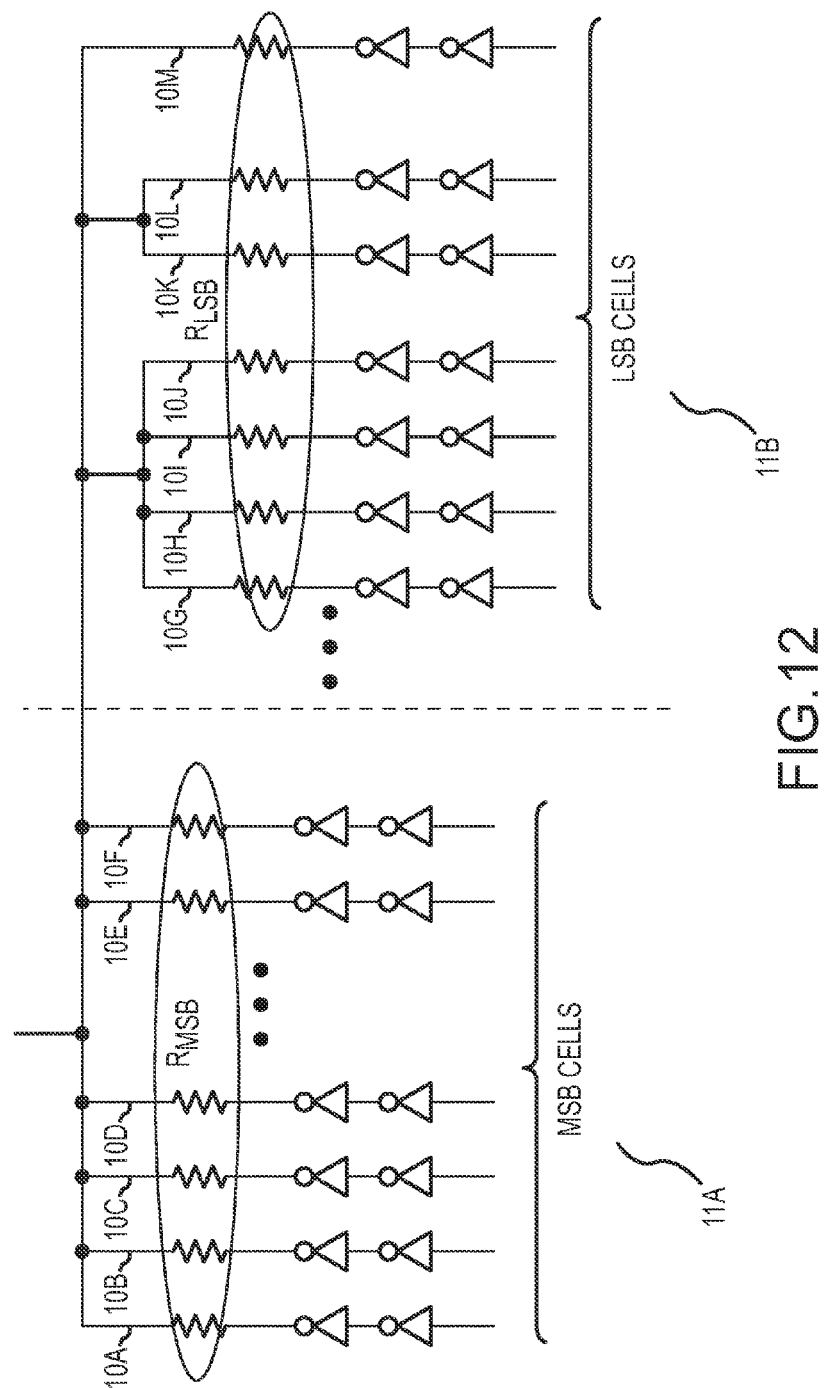
FIG. 12 is a circuit diagram illustrating an example of coding for an example n-bit segmented resistive digital-to-analog converter, in accordance with certain configurations of the present disclosure.

Now referring to FIG. 12, a circuit diagram illustrates exemplary coding of a side of an RDAC circuit. FIG. 12 illustrates an exemplary segmented RDAC and may include both binary and unary implementations. It is to be appreciated that the coding scheme described herein may be used in conjunction with a single-ended RDAC circuit, the sides of a fully differential RDAC circuit, as well as other RDAC configurations. According to one aspect, the plurality of resistive circuit branches of a side of an RDAC may comprise a first portion of resistive circuit branches 10a-f for receiving at least some most significant bits 11a and a second portion of resistive circuit branches 10g-h for receiving at least some least significant bits 11b. In yet another aspect, the first portion of resistive circuit branches 10a-f may be configured to be decoded in a different manner than the second portion of resistive circuit branches 10g-h. For example, the first portion of resistive circuit branches 10a-f may be configured to be decoded according to a unary coding scheme (also referred to as a thermometer coding scheme) on the at least some most significant bits, and the second portion of resistive circuit branches 10g-h may be configured to be decoded according to a binary coding on the at least some least significant bits.

Figure 20:
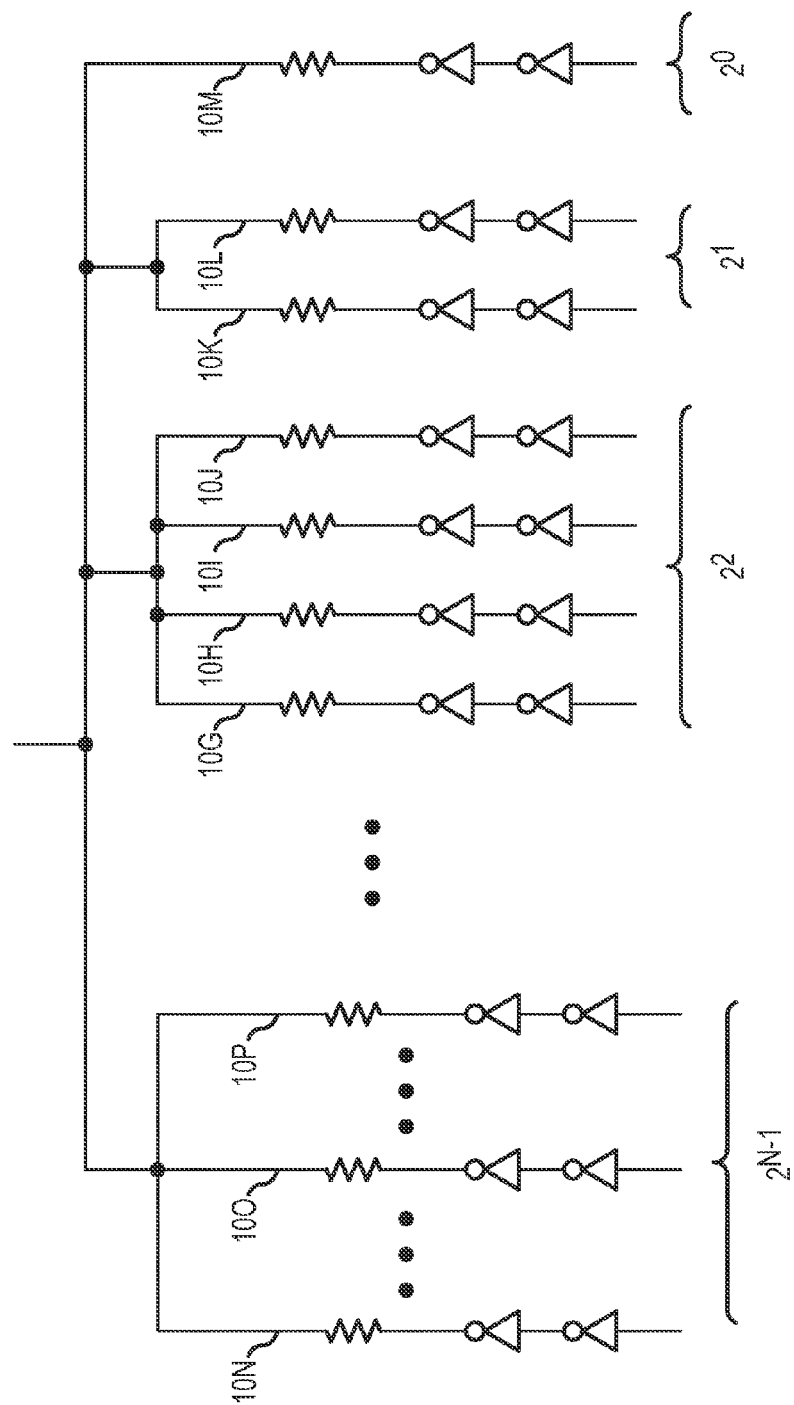
FIG. 20 is a circuit diagram illustrating an example of binary coding for an exemplary n-bit binary resistive digital-to-analog converter, in accordance with certain configurations of the present disclosure.
Figure 21:
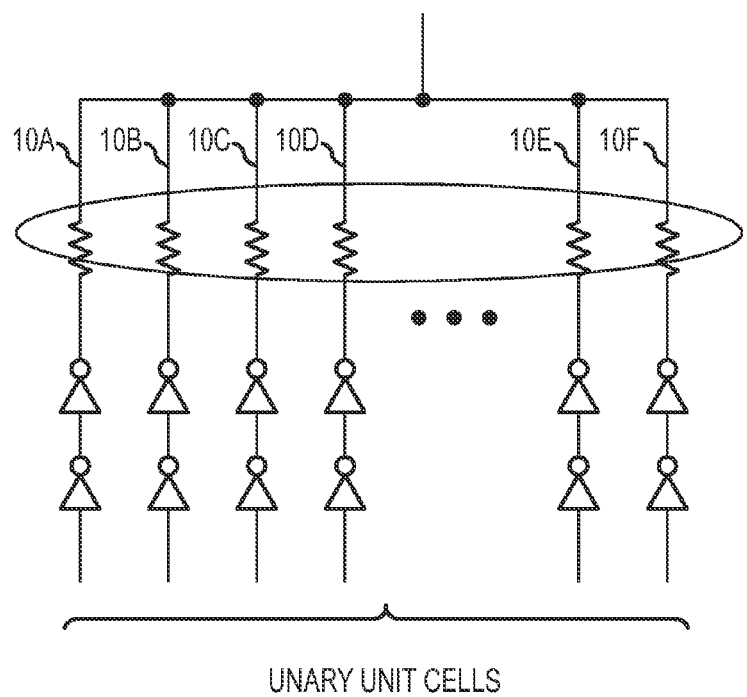
FIG. 21 is a circuit diagram illustrating an example of unary coding for an exemplary n-bit binary resistive digital-to-analog converter, in accordance with certain configurations of the present disclosure.

Note that FIGS. 20, 21, 14 and 13 are described below out of order simply for convenience. Additional scheming may be used for coding and/or balancing sides of the various RDAC circuits such as, but not limited to, the coding schemes provided in FIGS. 20 and 21. FIG. 20 is a circuit diagram illustrating an example of binary coding and FIG. 21 is a circuit diagram illustrating an example of unary coding. It is to be appreciated that variations of these coding schemes may be used with certain RDAC configurations of the present disclosure. Referring to FIG. 20, exemplary binary coding may include a plurality of portions of the resistive circuit branches. A $2^{N-1}$ portion may comprise $2^{N-1}$ resistive circuit branches. As illustrated, the $2^{N-1}$ portion may comprise resistive circuit branch 10n, ... to resistive circuit branch 10o, ... to resistive circuit branch 10p. A $2^2$ portion may comprise four resistive circuit branches 10g, 10h, 10i, and 10j. A $2^1$ portion may comprise two resistive circuit branches 10k and 10l, and a $2^0$ portion may comprise one resistive circuit branch 10m. The total number of resistive circuit branches will depend on the particular n-bit RDAC configuration and other aspects of the RDAC circuit configuration. For example, in a 4-bit RDAC implementation, a $2^{N-1}$ portion may comprise a $2^3$ portion having eight resistive circuit branches; a $2^2$ portion having four resistive circuit branches; a $2^1$ portion having two resistive circuit branches; and a $2^0$ portion having one resistive circuit branch. Binary codes to produce a corresponding analog output voltage may implemented in a 4-bit RDAC as provided in FIG. 14.

Figure 13:
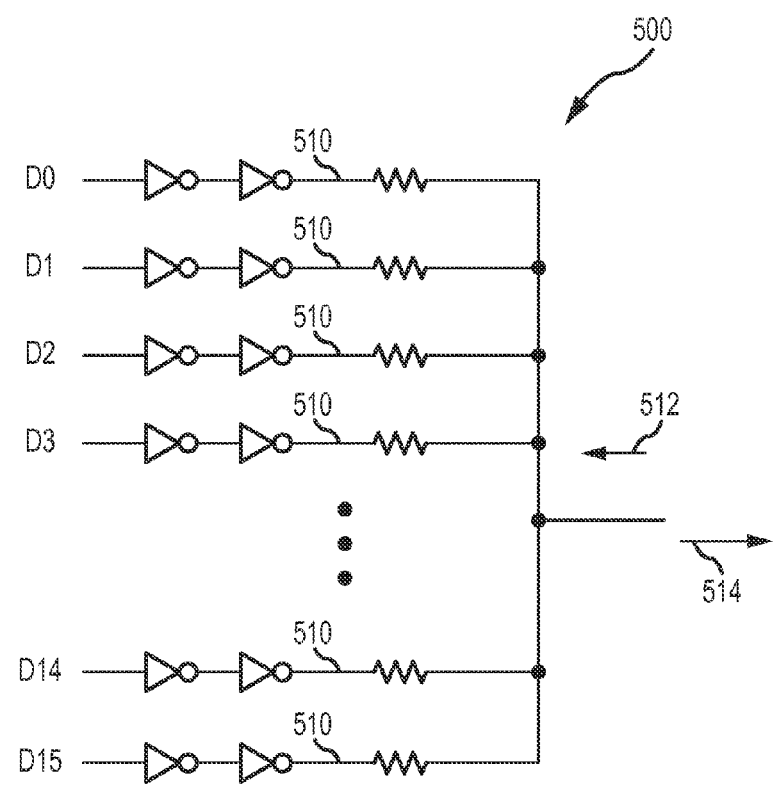
FIG. 13 is a circuit diagram illustrating a side of an example of a fully-differential resistive digital-to-analog converter, in accordance with certain configurations of the present disclosure.

FIG. 13 is a circuit diagram illustrating a side of an exemplary fully-differential RDAC. Impedance matching aspects of various RDAC configurations in the present disclosure are described with respect to FIG. 13. For example, a side of a fully-differential four-bit RDAC implementation 500 may have an equivalent impedance into (arrow 512) the plurality of resistive circuit branches 510 and the same equivalent impedance to (arrow 514) an external load. In one implementation, the equivalent impedance may be 50Ω. To obtain a 50Ω equivalent impedance in a 4-bit RDAC implementation, each resistive component may be approximately 800Ω (e.g., $2^4 \times 50 = 800Ω$). In other N-bit implementations of the RDAC whereby a 50Ω equivalent impedance is desired on a side of a fully-differential RDAC, each resistive component may be calculated by $2^N \times 50Ω = RΩ$.

Additionally, the side of four-bit RDAC implementation 500, or a portion thereof, may be thermometer coded. In a thermometer-coded implementation, a single resistive circuit branch may be represented by a unit signal level.

Referring now to FIG. 14, a table representing exemplary coding and analog output values of a side of an exemplary fully-differential RDAC is provided. For example, in a 4-bit fully-differential RDAC, there can be 16 (i.e., 24) possible levels of codes. Table 520 provides exemplary analog output voltages for corresponding digital codes in 1V full-scale configuration. It is to be understood that table 520 is just one example of possible analog output voltages associated with various aspects and implementations of the RDAC according to the present disclosure.

Figure 15:
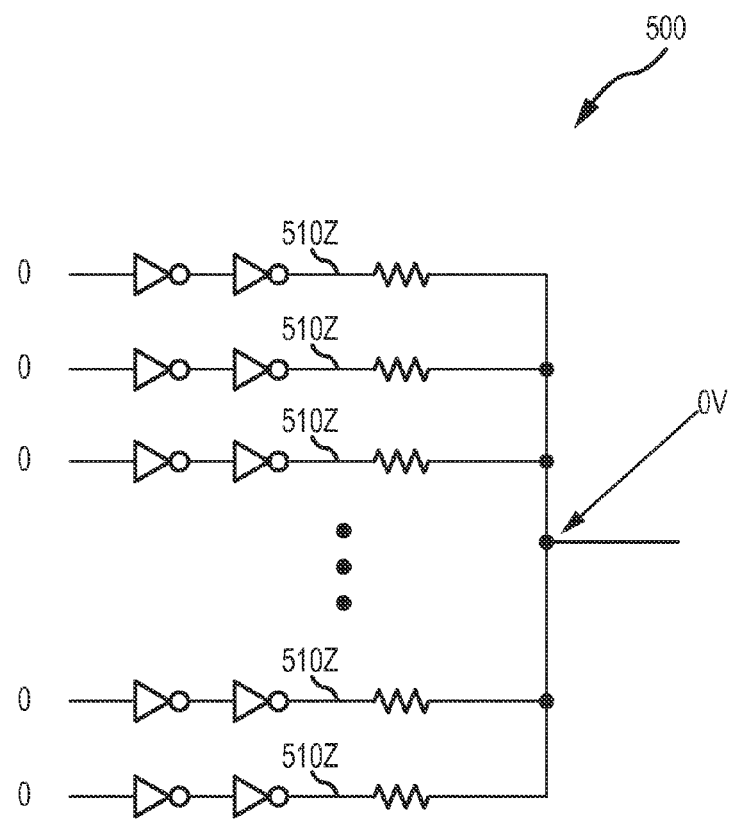
FIG. 15 is a circuit diagram illustrating an example of voltage computation for a side of an example of a fully-differential resistive digital-to-analog converter, in accordance with certain configurations of the present disclosure.
Figure 16:
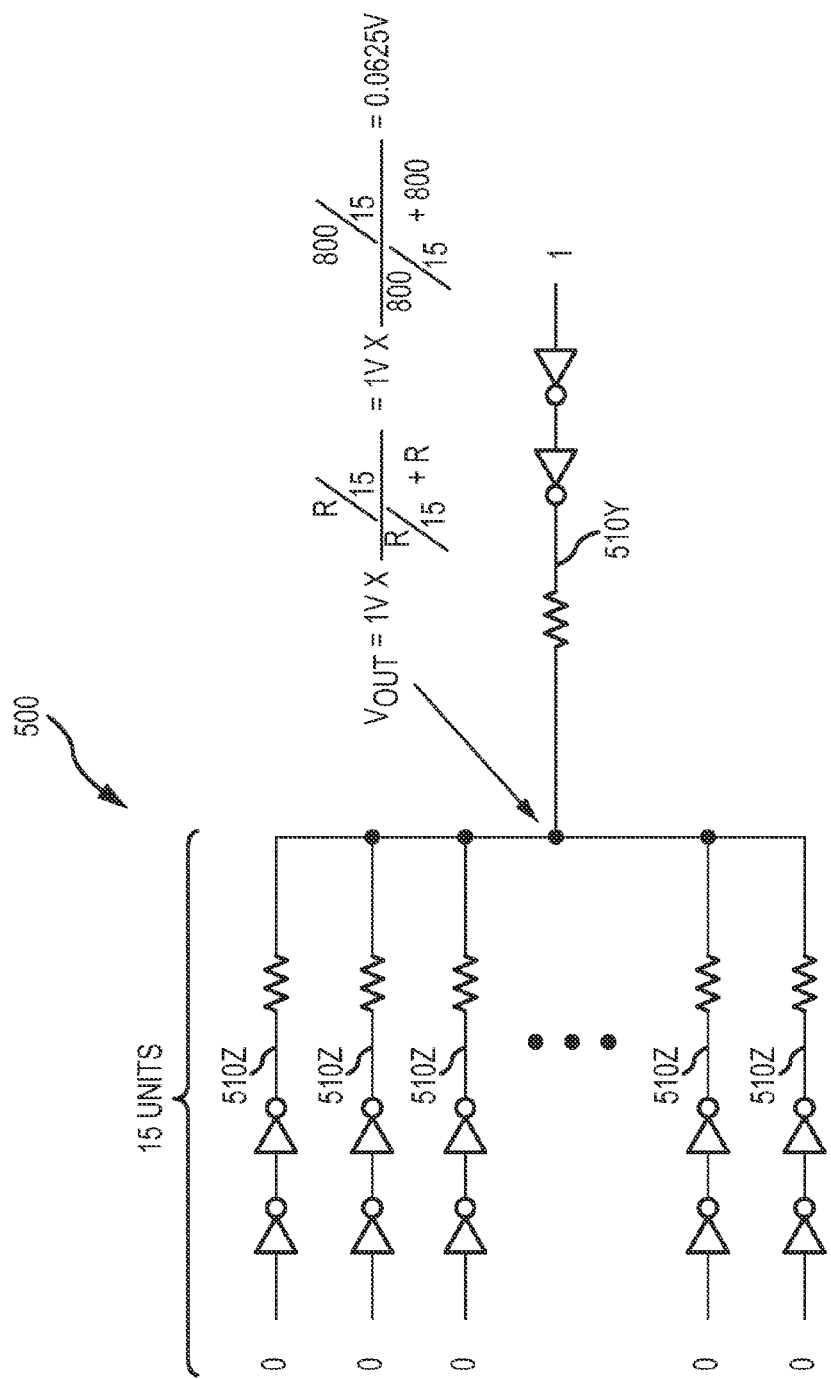
FIG. 16 is a circuit diagram illustrating an example of voltage computation for a side of an exemplary fully-differential resistive digital-to-analog converter, in accordance with certain configurations of the present disclosure.

FIGS. 15 through 18 are examples of analog voltage computations for various digital bit input combinations. In FIG. 15, the resulting analog voltage output may be 0V when each bit input of the n-bit digital input signal is a "0." In some configurations, all sixteen of the plurality of resistive circuit branches 510z may be connected to ground (or a particular supply voltage or reference voltage) to achieve the resulting analog voltage output of 0V for a 4-bit RDAC with code 0. As depicted in FIG. 16, the resulting analog voltage output may be 0.0625V when fifteen bit inputs of the n-bit digital input signal are a "0" and one bit input is a "1." In some configurations, fifteen of the plurality of resistive circuit branches 510z may be connected to ground (or a particular supply voltage or reference voltage) and one of the plurality of resistive circuit branches 510y may be connected to a supply voltage to achieve the resulting analog voltage output of 0.0625V for a 4-bit RDAC with code 1.

Figure 17:
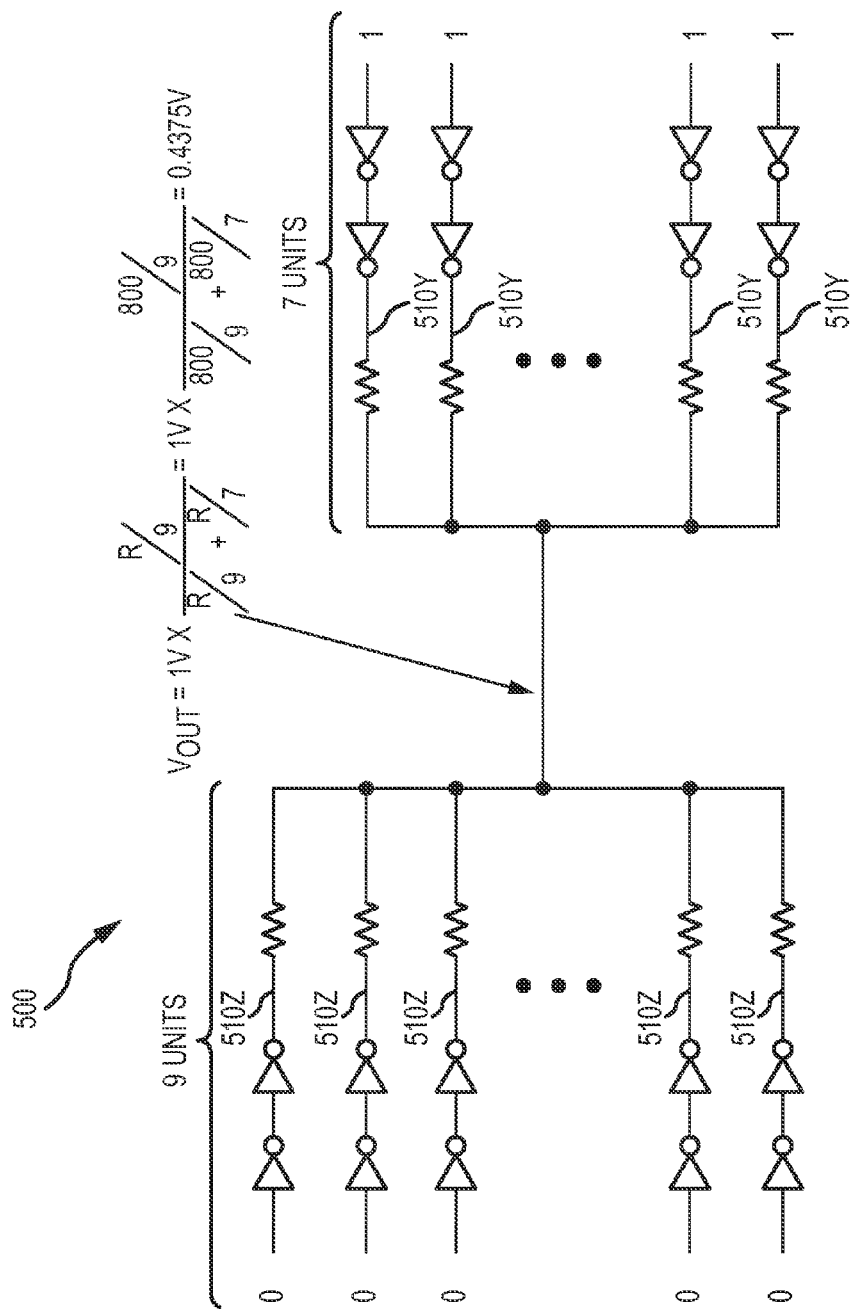
FIG. 17 is a circuit diagram illustrating an example of voltage computation for a side of an exemplary fully-differential resistive digital-to-analog converter, in accordance with certain configurations of the present disclosure.
Figure 18:
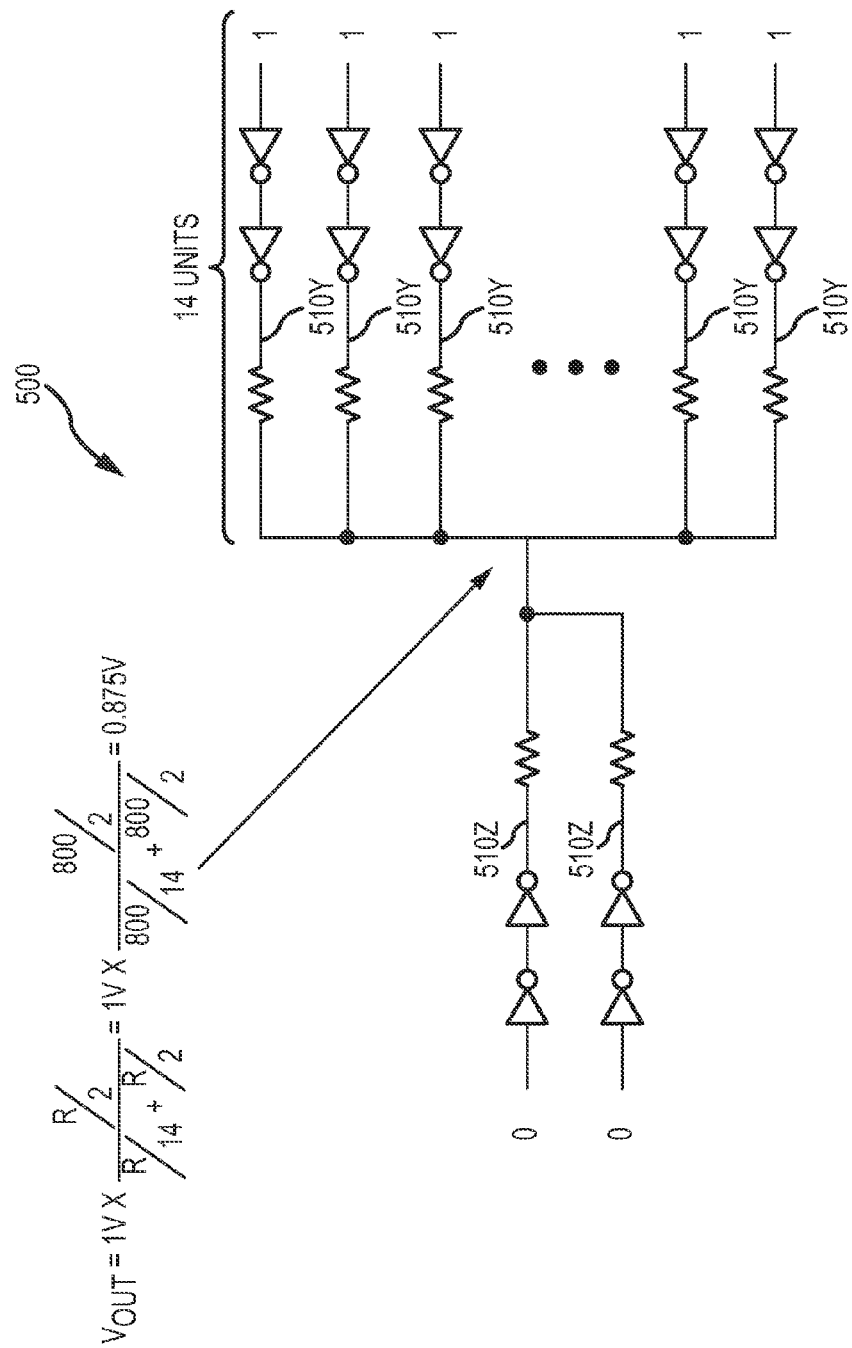
FIG. 18 is a circuit diagram illustrating an example of voltage computation for a side of an exemplary fully-differential resistive digital-to-analog converter, in accordance with certain configurations of the present disclosure.

FIG. 17 and 18 provide additional examples of analog voltage computations for various digital bit input combinations. As depicted in FIG. 17, the resulting analog voltage output may be 0.4375V when nine bit inputs of the n-bit digital input signal are a "0" and seven bit inputs are a "1." In some configurations, nine of the plurality of resistive circuit branches 510z may be connected to ground (or a particular supply voltage or reference voltage) and seven of the plurality of resistive circuit branches 510y may be connected to a supply voltage to achieve the resulting analog voltage output of 0.4375V for a 4-bit RDAC with code 7. As depicted in FIG. 18, the resulting analog voltage output may be 0.875V when two bit inputs of the n-bit digital input signal are a "0" and fourteen bit inputs are a "1." In some configurations, two of the plurality of resistive circuit branches 510z may be connected to ground (or a particular supply voltage or reference voltage) and fourteen of the plurality of resistive circuit branches 510y may be connected to a supply voltage to achieve the resulting analog voltage output of 0.875V for a 4-bit RDAC with code 14. Other computations for analog output voltages as shown in table 520 of FIG. 14, or other such code computational tables as contemplated under the present disclosure, may be similarly computed for various codes of a 4-bit RDAC or other n-bit RDACs.

Figure 19:
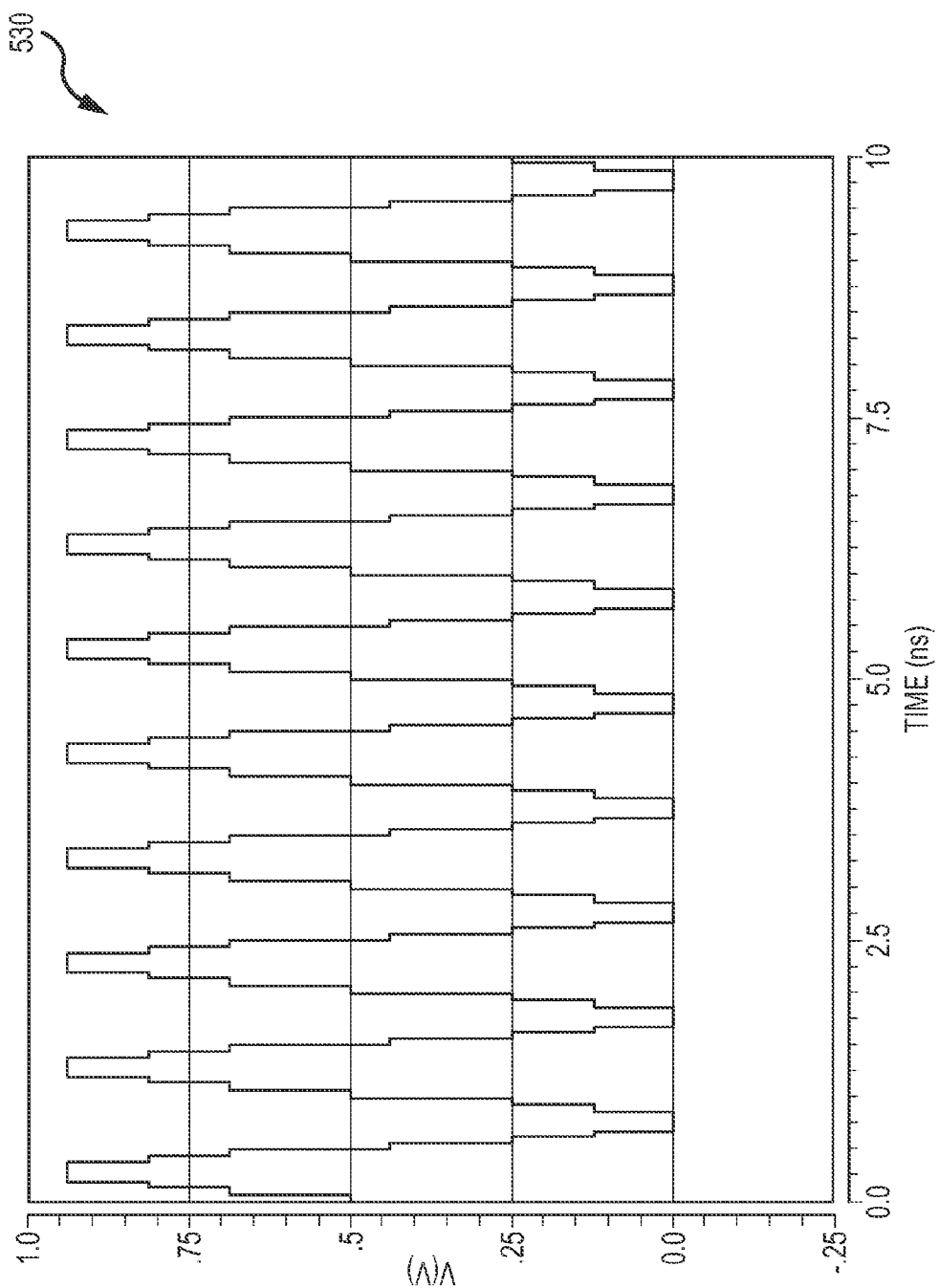
FIG. 19 illustrates an example of an analog output signal, in accordance with certain configurations of the present disclosure.

Referring now to FIG. 19, an exemplary analog output signal is illustrated. Exemplary analog output signal 530 is derived from a simulation of a 4-bit RDAC with an input signal frequency of 1 GHz and a sampling frequency of 16 GHz utilizing ideal components. In operation, various analog output signals may be provided by the various RDAC implementations of the present disclosure.

According to another aspect of the subject technology, methods of converting an analog output signal derived from an n-bit digital input signal are disclosed with reference to the various figures and descriptions herein. An exemplary method may comprise an operation of connecting, when an input bit is low, a first switch of a first inverter circuit to a first supply voltage. The method may also comprise an operation of opening, when the input bit is low, a second switch of the first inverter circuit, and an operation of opening, when the input bit is low, a first switch of a second inverter circuit. Additionally, the method may comprise an operation of connecting, when the input bit is low, a second switch of the second inverter circuit to a second supply voltage. The method may further comprise an operation of producing a output voltage for the input bit at a second end of a resistive component.

According to one aspect, the first switch of the second inverter circuit may comprise a first end operatively coupled to a third supply voltage and a second end operatively coupled to a first end of the resistive component. According to another aspect, the second switch of the second inverter circuit comprises a first end operatively coupled to the first end of the resistive component and a second end operatively coupled to the second supply voltage.

Moreover, the method may further comprise an operation of opening, when the input bit is high, the first switch of the first inverter circuit. The method may further comprise an operation connecting, when the input bit is high, the second switch of the first inverter circuit to a fourth supply voltage, and an operation of connecting, when the input bit is high, the first switch of the second inverter circuit to the second supply voltage. Additionally, the method may further comprise an operation of opening, when the input bit is high, the second switch of the second inverter circuit. In another method of converting an analog output signal derived from an n-bit digital input signal, a switching circuit may comprise first and second switches and may be configured to pull a resistive component up or down in order to provide an output voltage depending on an input bit.

Various examples of aspects of the disclosure are described as numbered clauses (1, 2, 3, etc.) below for convenience. These are provided as examples, and do not limit the subject technology. Identifications of the figures and reference numbers are provided below merely as examples and illustrative purposes, and the clauses are not limited by those identifications.

1. A resistive digital-to-analog converter (RDAC) circuit (e.g., 100 of FIG. 7) for providing an analog output signal derived from an n-bit digital input signal, the RDAC circuit comprising:
  a plurality of resistive circuit branches (e.g., 10 of FIGS. 1A-C) positioned in parallel, each of the plurality of resistive circuit branches comprising:
    a first inverter circuit (e.g., 14 or I1 of FIG. 1A) having a resistive circuit branch first end (e.g., 12 of FIG. 1A) configured to receive a bit input (e.g., D of FIG. 1A) of the n-bit digital input signal, and a second end configured to provide an output of the first inverter circuit,
    a second inverter circuit (e.g., 16 or I2 of FIG. 1A) having a first end operatively coupled to the second end of the first inverter circuit, and a second end configured to provide an output of the second inverter circuit, and
    a resistive component (e.g., 18 of FIG. 1A) having a first end operatively coupled to the second end of the second inverter circuit, and a resistive circuit branch second end (e.g., 22 of FIG. 1A) configured to provide an output voltage for the bit input; and
  an output node (e.g. 122 of FIG. 7) for providing the analog output signal, the output node being operatively coupled to each of the resistive circuit branch second ends.

2. The RDAC circuit of clause 1, wherein the first inverter circuit comprises a first switch 23 of FIG. 1B) configured to be connected to a first supply voltage (e.g., 54 of FIG. 1B), the first switch of the first inverter circuit having a first switch end configured to be operatively coupled to the first supply voltage and a second switch end operatively coupled to the second end of the first inverter circuit, and a second switch (e.g., 25 of FIG. 1B) configured to be connected to a second supply voltage (e.g., GND of FIG. 1B), the second switch of the first inverter circuit having a first switch end operatively coupled to the second end of the first inverter circuit and a second switch end configured to be operatively coupled to the second supply voltage.

3. The RDAC circuit of clause 2, wherein the first switch of the first inverter circuit comprises a PMOS transistor (e.g., 73 of FIG. 4), and the second switch of the first inverter circuit comprises an NMOS transistor (e.g., 75 of 4).

4. The RDAC circuit of clause 2, wherein the first inverter circuit further comprises a first retiming switch (e.g., 71 of FIG. 4) configured to receive a first retimed clocking signal, and a second retiming switch (e.g., 77 of FIG. 4 configured to receive a second retimed clocking signal.

5. The RDAC circuit of clause 1, wherein the second inverter circuit comprises a first switch (e.g., 24 of FIG. 1B) configured to be connected to a third supply voltage (e.g., 56 of FIG. 1B), the first switch of the second inverter circuit having a first switch end configured to be operatively coupled to the third supply voltage and a second switch end operatively coupled to the second end of the second inverter circuit, and a second switch (e.g., 26 of FIG. 1B) configured to be connected to a fourth supply voltage (e.g., GND of FIG. 1B), the second switch of the second inverter circuit having a first switch end operatively coupled to the second end of the second inverter circuit and a second switch end configured to be operatively coupled to the fourth supply voltage.

6. The RDAC circuit of clause 5, wherein the first switch of the second inverter circuit comprises a PMOS transistor (e.g., 33 of FIG. 1C), and the second switch of the second inverter circuit comprises an NMOS transistor (e.g., 35 of FIG. 1C).

7. The RDAC circuit of clause 5, wherein the second inverter circuit comprises calibration circuitry (e.g., FIGS. 2 and 3).

8. The RDAC circuit of clause 7, wherein the calibration circuitry comprises a first tuning switch (e.g., 43 of FIG. 2), a second tuning switch (e.g., 45 of FIG. 2), and a static tuning digital-to-analog circuit (e.g., 62 of FIG. 2), the first tuning switch being operatively coupled to the first switch of the second inverter circuit and the static tuning digital-to-analog circuit, and the second tuning switch being operatively coupled to the second switch of the second inverter circuit and the static tuning digital-to-analog circuit.

9. The RDAC circuit of clause 7, wherein the calibration circuitry comprises an auxiliary resistive ladder digital-to-analog circuit (e.g., 68A-H of FIG. 3), and the resistive component comprises two or more resistive segments (e.g., 18 A-D of FIG. 3), the auxiliary resistive ladder digital-to-analog circuit being operatively coupled to the two or more resistive segments via two or more tuning resistors (e.g., 64 of FIG. 3) and two or more calibration switches (e.g., 66 of FIG. 3).

10. The RDAC circuit of clause 2, further comprising:
a first passive filtering circuit (e.g., 90 of FIG. 6) configured to provide the first supply voltage (e.g., 54 of FIG. 1B via 93 of FIG. 6), the first passive filtering circuit configured to be operatively coupled to a voltage source (e.g., 97 of FIG. 6 via Vdd) and the second supply voltage (e.g., 95 of FIG. 6 via GND).

11. The RDAC circuit of clause 5, further comprising:
a second passive filtering circuit (e.g., 90 of FIG. 6) configured to provide the third supply voltage (e.g., 56 of FIG. 1B via 93 of FIG. 6), the second passive filtering circuit configured to be operatively coupled to a voltage source (e.g., 97 of FIG. 6 via Vdd) and the fourth supply voltage (e.g., 95 of FIG. 6 via GND).

12. The RDAC circuit of clause 1, wherein the plurality of resistive circuit branches comprises a first portion of resistive circuit branches for receiving at least some most significant bits (e.g., 11A of FIG. 12) and a second portion of resistive circuit branches for receiving at least some least significant bits (e.g., 11B of FIG. 12), wherein the first portion of resistive circuit branches are configured to be decoded in a different manner than the second portion of resistive circuit branches.

13. The RDAC circuit of clause 12, wherein the first portion of resistive circuit branches are configured to be decoded according to a unary coding on the at least some most significant bits, and the second portion of resistive circuit branches are configured to be decoded according to a binary coding on the at least some least significant bits.

14. The RDAC circuit of clause 1, wherein the resistive component is a single unit resistor (e.g., 18 of FIG. 1A).

15. The RDAC circuit of clause 1, further comprising a load resistive component (e.g. 336 of FIG. 8) operatively coupled to the output node (e.g., Vp of FIG. 8).

16. A fully-differential resistive digital-to-analog converter (RDAC) circuit (e.g., 200 of FIG. 8) for providing an analog output signal derived from an n-bit digital input signal, the fully-differential RDAC circuit comprising:
a first-side RDAC circuit (e.g., 232 of FIG. 8) comprising:
a plurality of first-side resistive circuit branches, each of the plurality of first-side resistive circuit branches comprising:
a first-side first inverter circuit e.g., 214 of FIG. 8) having a first-side resistive circuit branch first end (e.g., 212 of FIG. 8) configured to receive a first-side bit input (e.g., D0 of FIG. 8) from the n-bit digital input signal, and a second end configured to provide an output of the first-side first inverter circuit,
a first-side second inverter circuit (e.g., 216 of FIG. 8) having a first end operatively coupled to the second end of the first-side first inverter circuit, and a second end configured to provide an output of the first-side second inverter circuit, and
a first-side resistive component (e.g., 218 of FIG. 8) having a first end operatively coupled to the second end of the first-side second inverter circuit, and a first-side resistive circuit branch second end configured to provide an output voltage for the first-side bit input; and
a first-side output node (e.g., Vp of FIG. 8) operatively coupled to each of the first-side resistive circuit branch second ends; and a second-side RDAC circuit (e.g., 234 of FIG. 8) comprising:
a plurality of second-side resistive circuit branches, each of the plurality second-side resistive circuit branches comprising:
a second-side first inverter circuit 214 of FIG. 8) having a second-side resistive circuit branch first end (e.g., 212 of FIG. 8) configured to receive a second-side bit input (e.g., Db0 of FIG. 8), and a second end configured to provide an output of the second-side first inverter circuit,
a second-side second inverter circuit (e.g., 216 of FIG. 8) having a first end operatively coupled to the second end of the second-side first inverter circuit, and a second end configured to provide an output of the second-side second inverter circuit, and
a second-side resistive component (e.g., 218 of FIG. 8) having a first end operatively coupled to the second end of the second-side second inverter circuit, and a second-side resistive circuit branch second end configured to provide an output voltage for the second-side bit input; and
a second-side output node (e.g., Vn of FIG. 8) operatively coupled to each of the second-side resistive circuit branch second ends,
wherein each of the second-side bit inputs is configured to be a complementary bit input of a corresponding first-side bit input of the n-bit digital input signal (e.g., bit inputs Db0, Db1, Db2 . . . Db$2^N$–1 for second-side 234 are configured to be complements of bit inputs D0, D1, D2 . . . D$2^N$–1 for first-side 232 of FIG. 8),
wherein the first-side output node and the second-side output node (e.g., Vtot=Vp–Vn of FIG. 8) are configured to provide the analog output signal.

17. An interleaved resistive digital-to-analog converter (RDAC) circuit (e.g., 300 of FIG. 9) for providing an analog output signal derived from an n-bit digital input signal, the interleaved RDAC circuit comprising:
a first RDAC circuit (e.g., 200A of FIG. 9) comprising:
a plurality of first-side resistive circuit branches (e.g., 232A of FIG. 9), each of the plurality of first-side resistive circuit branches having a resistive circuit branch first end configured to receive a first-side bit input from the n-bit digital input signal and a resistive circuit branch second end configured to provide an output voltage for the first-side bit input,
a first node (e.g., 322A of FIG. 9) operatively coupled to the resistive circuit branch second end of each of the plurality of first-side resistive circuit branches,
a first switch (e.g., 326A of FIG. 9), the first switch having a first end operatively coupled to the first node (e.g., 322A of FIG. 9) and a second end operatively coupled to a first resistor (e.g., 336A of FIG. 9),
a second switch (e.g., 328A of FIG. 9), the second switch having a first end operatively coupled to the first node (e.g., 322A of FIG. 9) and a second end,
a plurality of second-side resistive circuit branches (e.g., 234A of FIG. 9), each of the plurality of second-side resistive circuit branches having a resistive circuit branch first end configured to receive a second-side bit input and a resistive circuit branch second end configured to provide an output voltage for the second-side bit input,
a second node (e.g., 342A of FIG. 9) operatively coupled to the resistive circuit branch second end of each of the second plurality of resistive circuit branches, a third switch (e.g., 346A of FIG. 9), the third switch having a first end operatively coupled to the second node (e.g., 342A of FIG. 9) and a second end operatively coupled to a second resistor (e.g., 338A of FIG. 9), and a fourth switch (e.g., 348A of FIG. 9), the fourth switch having a first end operatively coupled to the second node (e.g., 342A of FIG. 9) and a second end;

a second RDAC circuit (e.g. 200A of FIG. 9) comprising:

a plurality of third-side resistive circuit branches (e.g., 232B of FIG. 9), each of the plurality of third-side resistive circuit branches having a resistive circuit branch first end configured to receive a third-side bit input from the n-bit digital input signal and a resistive circuit branch second end configured to provide an output voltage for the third-side bit input, a third node (e.g., 322B of FIG. 9) operatively coupled to the resistive circuit branch second end of each of the plurality of third-side resistive circuit branches, a fifth switch (e.g., 326B of FIG. 9), the fifth switch having a first end operatively coupled to the third node (e.g., 322B of FIG. 9) and a second end operatively coupled to a third resistor (e.g., 336B of FIG. 9), a sixth switch (e.g., 328B of FIG. 9), the sixth switch having a first end operatively coupled to the third node (e.g., 322B of FIG. 9) and a second end, a plurality of fourth-side resistive circuit branches (e.g., 234B of FIG. 9), each of the plurality of fourth-side resistive circuit branches having a resistive circuit branch first end configured to receive a fourth-side bit input and a resistive circuit branch second end configured to provide an output voltage for the fourth-side bit input, a fourth node (e.g., 342B of FIG. 9) operatively coupled to the resistive circuit branch second end of each of the plurality of fourth-side resistive circuit branches, a seventh switch (e.g., 346B of FIG. 9), the seventh switch having a first end operatively coupled to the fourth node (e.g., 342B of 9) and a second end operatively coupled to a fourth resistor (e.g., 338B of FIG. 9), and an eighth switch (e.g., 348B of FIG. 9), the eighth switch having a first end operatively coupled to the fourth node (e.g., 342B of FIG. 9) and a second end;

a first output node (e.g., Vp of FIG. 9) operatively coupled to the second end of the second switch (e.g., 328A of FIG. 9) and the second end of the sixth switch (e.g., 328B of FIG. 9); and a second output node (e.g., Vn of FIG. 9) operatively coupled to the second end of the fourth switch (e.g., 348A of FIG. 9) and the second end of the eight switch (e.g., 348B of FIG. 9), wherein each of the second-side bit inputs is configured to be a complementary bit input of a corresponding first-side bit input, and each of the fourth-side bit inputs is configured to be a complementary bit input of a corresponding third-side bit input, wherein at least one of the plurality of first-side resistive circuit branches, the plurality of second-side resistive circuit branches, the plurality of third-side resistive circuit branches, and the plurality of fourth-side resistive circuit branches comprises:

a first inverter circuit (e.g., 14 or I1 of FIG. 1A) having a first end operatively coupled to the corresponding resistive circuit branch first end (e.g., 12 of FIG. 1A), and a second end configured to provide an output of the first inverter circuit, a second inverter circuit (e.g., 16 or I2 of FIG. 1A) having a first end operatively coupled to the second end of the first inverter circuit, and a second end configured to provide an output of the second inverter circuit, and a resistive component (e.g., 18 of FIG. 1A) having a first end operatively coupled to the second end of the second inverter circuit, and the corresponding resistive circuit branch second end (e.g., 22 of FIG. 1A).

18. The interleaved RDAC circuit of clause 17, wherein:

the first switch (e.g., 326A of FIG. 9), the third switch (e.g., 346A of FIG. 9), the sixth switch (e.g., 328B of FIG. 9), and the eight switch (e.g., 348B of FIG. 9) are configured to be turned on during a first clocking duration (e.g. 371 of FIG. 10); and the second switch (e.g., 328A of FIG. 9), the fourth switch (e.g., 348A of FIG. 9), the fifth switch (e.g., 326B of FIG. 9), and the seventh switch (e.g., 316B of FIG. 9) are configured to be turned off during the first clocking duration.

19. The interleaved RDAC circuit of clause 17, wherein:

the second switch (e.g., 328A of FIG. 9), the fourth switch (e.g., 348A of FIG. 9), the fifth switch (e.g., 326B of FIG. 9), and the seventh switch (e.g., 346B of FIG. 9) are configured to be turned on during a second clocking duration (e.g. 372 of FIG. 10); and the first switch 326A of FIG. 9), the third switch (e.g., 346A of FIG. 9), the sixth switch (e.g., 328B of FIG. 9), and the eight switch (e.g., 348B of FIG. 9) are configured to be turned off during the second clocking duration.

20. A method of converting an analog output signal derived from an n-bit digital input signal, the method comprising:

connecting, when an input bit is low, a first switch (e.g., 23 of FIG. 1B) of a first inverter circuit (e.g., 14 of FIG. 1B) to a first supply voltage (e.g., 54 of FIG. 1B);

opening, when the input bit is low, a second switch (e.g., 25 of FIG. 1B) of the first inverter circuit;

opening, when the input bit is low, a first switch (e.g., 24 of FIG. 1B) of a second inverter circuit (e.g., 16 of FIG. 1B);

connecting, when the input bit is low, a second switch (e.g., 26 of FIG. 1B) of the second inverter circuit to a second supply voltage (e.g., GND of FIG. 1B); and producing an output voltage for the input bit at a second end of a resistive component (e.g., 18 of FIG. 1B), wherein the first switch of the second inverter circuit comprises a first end operatively coupled to a third supply voltage (e.g., 56 of FIG. 1B) and a second end (e.g., X of FIG. 1B) operatively coupled to a first end of the resistive component (e.g., 18 of FIG. 1B), wherein the second switch of the second inverter circuit comprises a first end (e.g., X of FIG. 1B) operatively coupled to the first end of the resistive component and a second end operatively coupled to the second supply voltage.

21. The method of clause 20, further comprising:

converting an analog output signal derived from an n-bit digital input signal, the method comprising:

opening, when the input bit is high, the first switch (e.g., 23 of FIG. 1B) of the first inverter circuit (e.g., 14 of FIG. 1B);

connecting, when the input bit is high, the second switch (e.g., 25 of FIG. 1B) of the first inverter circuit to a fourth supply voltage (e.g., GND of FIG. 1B);

connecting, when the input bit is high, the first switch (e.g., 24 of FIG. 1B) of the second inverter circuit (e.g., 16 of FIG. 1B) to the second supply voltage; and opening, when the input bit is high, the second switch (e.g., 26 of FIG. 1B) of the second inverter circuit.

22. The method of clause 20, wherein the first supply voltage is higher than the third supply voltage.

23. A method of converting an analog output signal derived from an n-bit digital input signal, the method comprising:
connecting, when an input bit is high, a first switch (e.g., 24 of FIG. 1B) of a switching circuit (e.g., 16 of FIG. 1B) to a first supply voltage (e.g., 56 of FIG. 1B);
opening, when the input bit is high, a second switch (e.g., 26 of FIG. 1B) of the switching circuit; and
producing an output voltage for the input bit at an output node (e.g., 22 of FIG. 1B) coupled to a first end of a resistive component (e.g., 18 of FIG. 1B),
wherein the first switch of the switching circuit comprises a first end operatively coupled to the first supply voltage and a second end (e.g., X of FIG. 1B) operatively coupled to a second end of the resistive component,
wherein the second switch of the switching circuit comprises a first end (e.g., X of FIG. 1B) operatively coupled to the second end of the resistive component and a second end operatively coupled to a second supply voltage (e.g. GND of FIG. 1B).

24. The method of clause 23, further comprising:
opening, when the input bit is low, the first switch (e.g., 24 of FIG. 1B) of the switching circuit;
connecting, when the input bit is low, the second switch (e.g., 26 of FIG. 1B) of the switching circuit to the second supply voltage.

25. The method of clause 23, wherein the first supply voltage is a positive voltage and the second supply voltage is ground or approximately ground.

In one aspect, any of the clauses herein may depend from any one of the independent clauses or any one of the dependent clauses. In one aspect, any of the clauses (e.g., dependent or independent clauses) may be combined with any other clauses (e.g., dependent or independent clauses). In one aspect, a claim may include some or all of the words (e.g., steps, operations, means or components) recited in a clause, a sentence, a phrase or a paragraph. In one aspect, a claim may include some or all of the words recited in one or more clauses, sentences, phrases or paragraphs. In one aspect, some of the words in each of the clauses, sentences, phrases or paragraphs may be removed. In one aspect, additional words or elements may be added to a clause, a sentence, a phrase or a paragraph. In one aspect, the subject technology may be implemented without utilizing some of the components, elements, functions or operations described herein. In one aspect, the subject technology may be implemented utilizing additional components, elements, functions or operations.

In one aspect, any methods, instructions, code, means, logic, components, blocks, modules and the like (e.g., software or hardware) described or claimed herein can be represented in drawings (e.g., flow charts, block diagrams), such drawings (regardless of whether explicitly shown or not) are expressly incorporated herein by reference, and such drawings (if not yet explicitly shown) can be added to the disclosure without constituting new matter. For brevity, some (but not necessarily all) of the clauses/descriptions/claims are explicitly represented in drawings, but any of the clauses/descriptions/claims can be represented in drawings in a manner similar to those drawings explicitly shown. For example, a flow chart can be drawn for any of the clauses, sentences or claims for a method such that each operation or step is connected to the next operation or step by an arrow. In another example, a block diagram can be drawn for any of the clauses, sentences or claims having means-for elements (e.g., means for performing an action) such that each means-for element can be represented as a module for element (e.g., a module for performing an action).

Those of skill in the art would appreciate that items such as the various illustrative blocks, modules, elements, components, methods, operations, steps, and algorithms described herein may be implemented as hardware or a combination of hardware and software.

To illustrate the interchangeability of hardware and software, items such as the various illustrative blocks, modules, elements, components, methods, operations, steps, and algorithms have been described generally in terms of their functionality. Whether such functionality is implemented as hardware or software depends upon the particular application and design constraints imposed on the overall system. Skilled artisans may implement the described functionality in varying ways for each particular application.

In one aspect, "means," a block, a module, an element, a component or a processor may be an item (e.g., one or more of blocks, modules, elements, components or processors for performing one or more functions or operations. In one aspect, such an item may be an apparatus, hardware, or a portion thereof. In an example, an item may be implemented as one or more circuits configured to perform the function(s) or operation(s). A circuit may include one or more circuits and/or logic. A circuit may be analog and/or digital. A circuit may be electrical and/or optical. A circuit may include transistors. In an example, one or more items may be implemented as a processing system (e.g., a digital signal processor (DSP), no application specific integrated circuit (ASIC), a field programmable gate array (FPGA), etc.). In one example, an item may also include a structure in the form of, for example, an instruction(s) for performing the function(s) or operation(s), where the instruction(s) are encoded or stored on a machine-readable medium, on another device, or on a portion thereof, where an instruction(s) may be software, an application(s), a subroutine(s), or a portion thereof. Those skilled, in the art will recognize how to implement the instructions, circuits, and processing systems.

Unless otherwise mentioned, various configurations described in the present disclosure may be implemented on a Silicon, Silicon-Germanium (SiGe), Gallium Arsenide (GaAs), Indium Phosphide (InP) or Indium Gallium Phosphide (InGaP) substrate, or any other suitable substrate.

A reference to an element in the singular is not intended to mean "one and only one" unless specifically so stated, but rather "one or more." For example, a clock signal may refer to one or more clock signals, a control signal may refer to one or more control signals, an input signal may refer to one or more input signals, an output signal may refer to one or more output signals, and a signal may refer to differential voltage signals.

Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such a configuration may refer to one or more configurations and vice versa.

In one aspect of the disclosure, when actions or functions are described as being performed by an item (e.g., receiving, determining, providing, generating, converting, displaying, notifying, accepting, selecting, controlling, transmitting, reporting, sending, or any other action or function), it is understood that such actions or functions may be performed by the item directly or indirectly. In one aspect, when a module is described as performing an action, the module may be understood to perform the action directly. In one aspect, when a module is described as performing an action, the module may be understood to perform the action indirectly, for example, by facilitating, enabling or causing such an action.

In one aspect, unless otherwise stated, all measurements, values, ratings, positions, magnitudes, sizes, and other specifications that are set forth in this specification, including in the claims that follow, are approximate, not exact. In one aspect, they are intended to have a reasonable range that is consistent with the functions to which they relate and with what is customary in the art to which they pertain.

In one aspect, the term "coupled" or the like may refer to being directly coupled. In another aspect, the term "coupled" or the like may refer to being indirectly coupled.

Various items may be arranged differently (e.g., arranged in a different order, or partitioned in a different way) all without departing from the scope of the subject technology. In one aspect of the disclosure, the elements recited in the accompanying claims may be performed by one or more modules or sub-modules.

It is understood that the specific order or hierarchy of steps, operations or processes disclosed is an illustration of exemplary approaches. Based upon design preferences, it is understood that the specific order or hierarchy of steps, operations or processes may be rearranged. Some of the steps, operations or processes may be performed simultaneously. The accompanying method claims, if any, present elements of the various steps, operations or processes in a sample order, and are not meant to be limited to the specific order or hierarchy presented.

The disclosure is provided to enable any person skilled in the art to practice the various aspects described herein. The disclosure provides various examples of the subject technology, and the subject technology is not limited to these examples. Various modifications to these aspects will be readily apparent to those skilled in the art, and the generic principles defined herein may be applied to other aspects.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C, §112, sixth paragraph, unless the element is expressly recited using the phrase "means for" or, in the case of a method claim, the element is recited using the phrase "step for." Furthermore, to the extent that the term "include," "have," or the like is used, such term is intended to be inclusive in a manner similar to the term "comprise" as "comprise" is interpreted when employed as a transitional word in a claim.

The Title, Background, Summary, Brief Description of the Drawings and Abstract of the disclosure are hereby incorporated into the disclosure and are provided as illustrative examples of the disclosure, not as restrictive descriptions. It is submitted with the understanding that they will not be used to limit the scope or meaning of the claims. In addition, in the Detailed Description, it can be seen that the description provides illustrative examples and the various features are grouped together in various embodiments for the purpose of streamlining the disclosure. This method of disclosure is not to be interpreted as reflecting an intention that the claimed subject matter requires more features than are expressly recited in each claim. Rather, as the following claims reflect, inventive subject matter lies in less than all features of a single disclosed configuration or operation. The following claims are hereby incorporated into the Detailed Description, with each claim standing on its own as a separately claimed subject matter.

The claims are not intended to be limited to the aspects described herein, but is to be accorded the full scope consistent with the language claims and to encompass all legal equivalents. Notwithstanding, none of the claims are intended to embrace subject matter that fails to satisfy the requirement of 35 U.S.C. §101, 102, or 103, nor should they be interpreted in such a way. Any unintended embracement of such subject matter is hereby disclaimed.

What is claimed is:

1. A resistive digital-to-analog converter (RDAC) circuit for providing an analog output signal derived from an n-bit digital input signal, the RDAC circuit comprising:

a plurality of resistive circuit branches positioned in parallel, each of the plurality of resistive circuit branches comprising:

a first inverter circuit having a resistive circuit branch first end configured to receive a bit input of the n-bit digital input signal, and a second end configured to provide an output of the first inverter circuit, wherein the first inverter circuit is configured to utilize one or more retimed clocking signals, configured to be connected to a first supply voltage, and configured to be connected to a second supply voltage, a second inverter circuit having a first end operatively coupled to the second end of the first inverter circuit, and a second end configured to provide an output of the second inverter circuit, and a resistive component having a first end operatively coupled to the second end of the second inverter circuit, and a resistive circuit branch second end configured to provide an output voltage for the bit input; and an output node for providing the analog output signal, the output node being operatively coupled to each of the resistive circuit branch second ends.

2. The RDAC circuit of claim 1, wherein the first inverter circuit comprises a first switch configured to be connected to the first supply voltage, the first switch of the first inverter circuit having a first switch end configured to be operatively coupled to the first supply voltage and a second switch end operatively coupled to the second end of the first inverter circuit, and a second switch configured to be connected to the second supply voltage, the second switch of the first inverter circuit having a first switch end operatively coupled to the second end of the first inverter circuit and a second switch end configured to be operatively coupled to the second supply voltage.

3. The RDAC circuit of claim 2, wherein the first switch of the first inverter circuit comprises a PMOS transistor, and the second switch of the first inverter circuit comprises an NMOS transistor.

4. The RDAC circuit of claim 1, wherein the first inverter circuit comprises a first retiming switch configured to receive a first one of the one or more retimed clocking signals, and a second retiming switch configured to receive a second one of the one or more retimed clocking signals.

5. The RDAC circuit of claim 1, wherein the second inverter circuit comprises a first switch configured to be connected to a third supply voltage, the first switch of the second inverter circuit having a first switch end configured to be operatively coupled to the third supply voltage and a second switch end operatively coupled to the second end of the second inverter circuit, and a second switch configured to be connected to a fourth supply voltage, the second switch of the second inverter circuit having a first switch end operatively coupled to the second end of the second inverter circuit and a second switch end configured to be operatively coupled to the fourth supply voltage.

6. The RDAC circuit of claim 5, wherein the first switch of the second inverter circuit comprises a PMOS transistor, and the second switch of the second inverter circuit comprises an NMOS transistor.

7. The RDAC circuit of claim 5, wherein the second inverter circuit comprises a first tuning switch, a second tuning switch, and a static tuning digital-to-analog circuit, the first tuning switch being operatively coupled to the first switch of the second inverter circuit and the static tuning digital-to-analog circuit, and the second tuning switch being operatively coupled to the second switch of the second inverter circuit and the static tuning digital-to-analog circuit.

8. The RDAC circuit of claim 5, wherein the second inverter circuit comprises an auxiliary resistive ladder digital-to-analog circuit, and the resistive component comprises two or more resistive segments, the auxiliary resistive ladder digital-to-analog circuit being operatively coupled to the two or more resistive segments via two or more tuning resistors and two or more calibration switches.

9. The RDAC circuit of claim 5, further comprising:
a second passive filtering circuit configured to provide the third supply voltage, the second passive filtering circuit configured to be operatively coupled to a voltage source and the fourth supply voltage.

10. The RDAC circuit of claim 1, wherein the second inverter circuit comprises circuitry for calibration.

11. The RDAC circuit of claim 1, further comprising:
a first passive filtering circuit configured to provide the first supply voltage, the first passive filtering circuit configured to be operatively coupled to a voltage source and the second supply voltage.

12. The RDAC circuit of claim 1, wherein the plurality of resistive circuit branches comprises a first portion of resistive circuit branches for receiving at least some most significant bits and a second portion of resistive circuit branches for receiving at least some least significant bits, wherein the first portion of resistive circuit branches are configured to be decoded in a different manner than the second portion of resistive circuit branches.

13. The RDAC circuit of claim 12, wherein the first portion of resistive circuit branches are configured to be decoded according to a unary coding on the at least some most significant bits, and the second portion of resistive circuit branches are configured to be decoded according to a binary coding on the at least some least significant bits.

14. The RDAC circuit of claim 1, wherein the resistive component is a single unit resistor.

15. The RDAC circuit of claim 1, further comprising a load resistive component operatively coupled to the output node.

16. A fully-differential resistive digital-to-analog converter (RDAC) circuit for providing an analog output signal derived from an n-bit digital input signal, the fully-differential RDAC circuit comprising:
a first-side RDAC circuit comprising:
a plurality of first-side resistive circuit branches, each of the plurality of first-side resistive circuit branches comprising:
a first-side first inverter circuit having a first-side resistive circuit branch first end configured to receive a first-side bit input from the n-bit digital input signal, and a second end configured to provide an output of the first-side first inverter circuit, wherein the first-side first inverter circuit is configured to utilize one or more retimed clocking signals, configured to be connected to a first supply voltage, and configured to be connected to a second supply voltage,
a first-side second inverter circuit having a first end operatively coupled to the second end of the first-side first inverter circuit, and a second end configured to provide an output of the first-side second inverter circuit, and
a first-side resistive component having a first end operatively coupled to the second end of the first-side second inverter circuit, and a first-side resistive circuit branch second end configured to provide an output voltage for the first-side bit input; and
a first-side output node operatively coupled to each of the first-side resistive circuit branch second ends; and
a second-side RDAC circuit comprising:
a plurality of second-side resistive circuit branches, each of the plurality second-side resistive circuit branches comprising:
a second-side first inverter circuit having a second-side resistive circuit branch first end configured to receive a second-side bit input, and a second end configured to provide an output of the second-side first inverter circuit, wherein the second-side first inverter circuit is configured to utilize one or more retimed clocking signals, configured to be connected to the first supply voltage, and configured to be connected to the second supply voltage,
a second-side second inverter circuit having a first end operatively coupled to the second end of the second-side first inverter circuit, and a second end configured to provide an output of the second-side second inverter circuit, and
a second-side resistive component having a first end operatively coupled to the second end of the second-side second inverter circuit, and a second-side resistive circuit branch second end configured to provide an output voltage for the second-side bit input; and
a second-side output node operatively coupled to each of the second-side resistive circuit branch second ends,
wherein each of the second-side bit inputs is configured to be a complementary bit input of a corresponding first-side bit input of the n-bit digital input signal, wherein the first-side output node and the second-side output node are configured to provide the analog output signal.

17. The fully-differential RDAC circuit of claim 16, wherein the first-side first inverter circuit comprises a first-side first retiming switch configured to receive a first one of the one or more retimed clocking signals, and a first-side second retiming switch configured to receive a second one of the one or more retimed clocking signals, and wherein the second-side first inverter circuit comprises a second-side first retiming switch configured to receive the first one of the one or more retimed clocking signals, and a first-side second retiming switch configured to receive the second one of the one or more retimed clocking signals.

18. The fully differential RDAC circuit of claim 16, wherein the first-side second inverter circuit comprises circuitry for calibration, and the second-side second inverter circuit comprises circuitry for calibration.

19. An interleaved resistive digital-to-analog converter (RDAC) circuit for providing an analog output signal derived from an n-bit digital input signal, the interleaved RDAC circuit comprising:
   a first RDAC circuit comprising:
      a plurality of first-side resistive circuit branches, each of the plurality of first-side resistive circuit branches having a resistive circuit branch first end configured to receive a first-side bit input from the n-bit digital input signal and a resistive circuit branch second end configured to provide an output voltage for the first-side bit input,
      a first node operatively coupled to the resistive circuit branch second end of each of the plurality of first-side resistive circuit branches,
      a first switch, the first switch having a first end operatively coupled to the first node and a second end operatively coupled to a first resistor,
      a second switch, the second switch having a first end operatively coupled to the first node and a second end,
      a plurality of second-side resistive circuit branches, each of the plurality of second-side resistive circuit branches having a resistive circuit branch first end configured to receive a second-side bit input and a resistive circuit branch second end configured to provide an output voltage for the second-side bit input,
      a second node operatively coupled to the resistive circuit branch second end of each of the second plurality of resistive circuit branches,
      a third switch, the third switch having a first end operatively coupled to the second node and a second end operatively coupled to a second resistor, and
      a fourth switch, the fourth switch having a first end operatively coupled to the second node and a second end;
   a second RDAC circuit comprising:
      a plurality of third-side resistive circuit branches, each of the plurality of third-side resistive circuit branches having a resistive circuit branch first end configured to receive a third-side bit input from the n-bit digital input signal and a resistive circuit branch second end configured to provide an output voltage for the third-side bit input,
      a third node operatively coupled to the resistive circuit branch second end of each of the plurality of third-side resistive circuit branches,
      a fifth switch, the fifth switch having a first end operatively coupled to the third node and a second end operatively coupled to a third resistor,
      a sixth switch, the sixth switch having a first end operatively coupled to the third node and a second end,
      a plurality of fourth-side resistive circuit branches, each of the plurality of fourth-side resistive circuit branches having a resistive circuit branch first end configured to receive a fourth-side bit input and a resistive circuit branch second end configured to provide an output voltage for the fourth-side bit input,
      a fourth node operatively coupled to the resistive circuit branch second end of each of the plurality of fourth-side resistive circuit branches,
      a seventh switch, the seventh switch having a first end operatively coupled to the fourth node and a second end operatively coupled to a fourth resistor, and
      an eighth switch, the eighth switch having a first end operatively coupled to the fourth node and a second end;
   a first output node operatively coupled to the second end of the second switch and the second end of the sixth switch; and
   a second output node operatively coupled to the second end of the fourth switch and the second end of the eight switch,
wherein each of the second-side bit inputs is configured to be a complementary bit input of a corresponding first-side bit input, and each of the fourth-side bit inputs is configured to be a complementary bit input of a corresponding third-side bit input,
wherein at least one of the plurality of first-side resistive circuit branches, the plurality of second-side resistive circuit branches, the plurality of third-side resistive circuit branches, and the plurality of fourth-side resistive circuit branches comprises:
   a first inverter circuit having a first end operatively coupled to the corresponding resistive circuit branch first end, and a second end configured to provide an output of the first inverter circuit, wherein the first inverter circuit is configured to utilize one or more retimed clocking signals, configured to be connected to a first supply voltage, and configured to be connected to a second supply voltage,
   a second inverter circuit having a first end operatively coupled to the second end of the first inverter circuit, and a second end configured to provide an output of the second inverter circuit, and
   a resistive component having a first end operatively coupled to the second end of the second inverter circuit, and the corresponding resistive circuit branch second end.

20. The interleaved RDAC circuit of claim 19, wherein:
the first switch, the third switch, the sixth switch, and the eight switch are configured to be turned on during a first clocking duration; and
the second switch, the fourth switch, the fifth switch, and the seventh switch are configured to be turned off during the first clocking duration.

21. The interleaved RDAC circuit of claim 19, wherein:
the second switch, the fourth switch, the fifth switch, and the seventh switch are configured to be turned on during a second clocking duration; and
the first switch, the third switch, the sixth switch, and the eight switch are configured to be turned off during the second clocking duration.

22. The interleaved RDAC circuit of claim 19, wherein the first inverter circuit comprises a first retiming switch configured to receive a first one of the one or more retimed clocking signals, and a second retiming switch configured to receive a second one of the one or more retimed clocking signals.

23. The interleaved RDAC circuit of claim 19, wherein the second inverter circuit comprises circuitry for calibration.

24. A method of converting an analog output signal derived from an n-bit digital input signal, the method comprising:
- retiming clocking to produce one or more retimed clocking signals for use with a switching circuit having at least one retiming switch;
- connecting, when an input bit is high, a first switch of the switching circuit to a first supply voltage;
- opening, when the input bit is high, a second switch of the switching circuit; and
- producing an output voltage for the input bit at an output node coupled to a first end of a resistive component,
- wherein the first switch of the switching circuit comprises a first end operatively coupled to the first supply voltage and a second end operatively coupled to a second end of the resistive component,
- wherein the second switch of the switching circuit comprises a first end operatively coupled to the second end of the resistive component and a second end operatively coupled to a second supply voltage.

25. The method of claim 24, further comprising:
- opening, when the input bit is low, the first switch of the switching circuit;
- connecting, when the input bit is low, the second switch of the switching circuit to the second supply voltage.

26. The method of claim 24, wherein the first supply voltage is a positive voltage and the second supply voltage is ground.

\* \* \* \* \*